(12) United States Patent
Endres et al.

(10) Patent No.: US 10,409,167 B2
(45) Date of Patent: Sep. 10, 2019

(54) METHOD FOR ILLUMINATING AN OBJECT FIELD OF A PROJECTION EXPOSURE SYSTEM

(71) Applicant: Carl Zeiss SMT GmbH, Oberkochen (DE)

(72) Inventors: Martin Endres, Koenigsbronn (DE); Johannes Eisenmenger, Ulm (DE); Stig Bieling, Aalen (DE); Markus Hauf, Ulm (DE); Lars Wischmeier, Aalen (DE); Fabian Haacker, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/226,189

(22) Filed: Aug. 2, 2016

(65) Prior Publication Data

US 2016/0342094 A1    Nov. 24, 2016

Related U.S. Application Data

(63) Continuation of application No. PCT/EP2015/053285, filed on Feb. 17, 2015.

(30) Foreign Application Priority Data

Feb. 21, 2014   (DE) .................. 10 2014 203 188

(51) Int. Cl.
*G03B 27/42*     (2006.01)
*G03F 7/20*      (2006.01)
(Continued)

(52) U.S. Cl.
CPC ......... *G03F 7/702* (2013.01); *G02B 19/0019* (2013.01); *G02B 19/0095* (2013.01);
(Continued)

(58) Field of Classification Search
CPC .. G03F 7/702; G03F 7/70075; G03F 7/70091; G03F 7/70291; G03F 1/24;
(Continued)

(56) References Cited

U.S. PATENT DOCUMENTS 7,145,269 B2    12/2006   Hol et al.
2008/0013680 A1  1/2008   Singer et al.
(Continued)

FOREIGN PATENT DOCUMENTS

DE    10 2010 029 765 A1   12/2011
DE    10 2011 076 145 A1   11/2012
(Continued)

OTHER PUBLICATIONS

Translation of International Search Report for corresponding PCT Appl No. PCT/EP2015/053285, dated May 18, 2015.
(Continued)

*Primary Examiner* — Mesfin T Asfaw
(74) *Attorney, Agent, or Firm* — Fish & Richardson P.C.

(57) ABSTRACT

A method for illuminating an object field of a projection exposure apparatus includes providing a subset of first facets to be positioned in park positions, which are each spaced apart from an associated target position, but at most by a maximum distance.

17 Claims, 15 Drawing Sheets

(51) Int. Cl.
*G02B 19/00* (2006.01)
*G02B 26/08* (2006.01)

(52) U.S. Cl.
CPC ...... *G03F 7/70075* (2013.01); *G03F 7/70116* (2013.01); *G02B 26/0833* (2013.01)

(58) Field of Classification Search
CPC .... G03F 7/70108; G03F 7/70558; G03F 7/20; G03F 7/70058; G03F 7/70125; G03F 7/70225; G03F 1/52; G03F 2007/2067; G03F 7/70; G03F 7/70141; G02B 19/0019; G02B 5/09
See application file for complete search history.

(56) References Cited

U.S. PATENT DOCUMENTS

2009/0066926 A1* 3/2009 Sandstrom .......... G03F 7/70041
  355/53
2015/0153650 A1   6/2015 Deguenther

FOREIGN PATENT DOCUMENTS

| | | |
|---|---|---|
| DE | 10 2012 207 572 A1 | 5/2013 |
| DE | 10 2012 213 515 A1 | 2/2014 |
| EP | 1 225 481 A2 | 7/2002 |
| JP | 2005-518659 A | 6/2005 |
| JP | 2012-505533 A | 3/2012 |
| WO | WO 03/071353 A2 | 8/2003 |
| WO | WO 2007/134574 A | 11/2007 |
| WO | WO 2010/040506 A1 | 4/2010 |
| WO | WO 2010/049076 A2 | 5/2010 |
| WO | WO 2011/154244 A1 | 12/2011 |
| WO | WO 2013/164207 A | 11/2013 |
| WO | WO 2014/019675 A1 | 2/2014 |

OTHER PUBLICATIONS

German Office Action, with translation thereof, for corresponding DE Appl No. 10 2014 203 188.5, dated Oct. 10, 2014.
Japanese Office Action, with translation thereof, for corresponding Appl No. 2016-553537, dated Feb. 28, 2019.

* cited by examiner

METHOD FOR ILLUMINATING AN OBJECT FIELD OF A PROJECTION EXPOSURE SYSTEM

CROSS-REFERENCE TO RELATED APPLICATIONS

The present application is a continuation of, and claims benefit under 35 USC 120 to, international application PCT/EP2015/053285, filed Feb. 17, 2015, which claims benefit under 35 USC 119 of German Application No. 10 2014 203 188.5, filed Feb. 21, 2014. The entire disclosure of international application PCT EP2015/053285 and German Application No. 10 2014 203 188.5 are incorporated by reference herein.

FIELD

The disclosure relates to a method for illuminating an object field of a projection exposure apparatus. The disclosure furthermore relates to an illumination optical unit for carrying out the method. Moreover, the disclosure relates to an illumination system and a projection exposure apparatus including such an illumination optical unit, a method for lithographic structuring of a wafer, a method for producing a microstructured or nanostructured component and a component produced according to the method.

BACKGROUND

DE 10 2011 076 145 A1 discloses a method for illuminating an object field of a projection exposure apparatus, in which pupil facets and field facets are assigned to one another to form illumination channels.

SUMMARY

The present disclosure seeks to provide an improved method for illuminating an object field of a projection exposure apparatus.

In one aspect, the disclosure provides a method for illuminating an object field of a projection exposure apparatus. The method includes providing an illumination device for generating illumination radiation, providing an illumination optical unit for guiding the illumination radiation from the illumination device to an object field. The illumination optical unit includes a first facet mirror with a multiplicity of first facets, and a second facet mirror with a multiplicity of second facets. The first facets are each formed from a multiplicity of displaceable individual mirrors, and the first facets each can be assigned to at least one of the second facets to form at least one illumination channel. The method also includes predetermining an intended illumination of the object field, and determining target positions for the individual mirrors of the first facets in a manner dependent on the predetermined intended illumination. The method further includes determining at least one park position for the individual mirrors of the first facets in each case. The park positions are each spaced apart from an associated target position, but at most by a maximum distance, $d_{max}$. In addition, the method includes positioning the individual mirrors of the first facets. A subset of the individual mirrors of the first facets are positioned in the park positions.

According to the disclosure, provision is made for target positions for the facets of a first facet mirror to be determined in order to enable a predetermined intended illumination of an object field. A feature of the disclosure involves embodying the facets of the first facet mirror with a multiplicity of displaceable individual mirrors and in positioning a subset of these individual mirrors in park positions which are spaced apart from a respectively associated target position. In so doing, the park positions are selected in such a way, in particular, that they are spaced apart from the respectively associated target positions, but at most by a maximum distance $d_{max}$. By predetermining such a maximum distance $d_{max}$, it is possible to restrict the switching path and, in particular, the switching time for displacing the individual mirrors from the park position into the associated target position. The provision of such park positions for the individual mirrors of the first facets renders possible fast connecting and/or switching off of same.

In particular, the individual mirrors are tiltable. In particular, the switching path is a tilt angle.

In particular, the individual mirrors are grouped in such a way that the individual groups form the facets of the first facet mirror. Here, this grouping is modifiable in a flexible manner. Therefore, the facets are also referred to as virtual facets.

If the second facet mirror is arranged in the region of a pupil plane, the virtual first facets are substantially independent of the position of the second facets. Such an embodiment is also referred to as a honeycomb condenser.

If the second facet mirror is arranged at a distance from a pupil plane, the form and/or dimensions of the virtual first facets is/are generally dependent on the position of the second facet and/or the pupil form. Such an embodiment is also referred to as a specular reflector.

The groups of individual mirrors which form the virtual first facets need not necessarily be simply connected.

The present disclosure is equally applicable to the concept of the honeycomb condenser and the concept of the specular reflector.

The target positions are also referred to as used positions. They specify those positionings in which the illumination radiation reflected by the respective first facets, in particular by the individual mirrors of the first facets, forms an illumination channel with a predetermined second facet on the second facet mirror for illuminating the object field. Here, the first facets can in each case illuminate the whole object field. It is also possible that the first facets in each case only illuminate a portion of the object field, in particular in the range of 1% to 80%, in particular in the range of 10% to 50%, in particular in the range of 20% to 30% of the object field.

In particular, the first facets include a multiplicity of displaceable individual mirrors. In particular, they are formed by mirror arrays with a multiplicity of displaceable individual mirrors, in particular micro-mirrors. In the region of the object plane, the images of the individual mirrors each have an extent which lies in the range of 0.1% to 10%, in particular in the range of 0.2% to 5%, in particular in the range of 0.3% to 3%, in particular in the range of 0.5% to 2% of the width of the object field perpendicular to the scanning direction. In particular, two to 50, in particular 3 to 30, in particular 5 to 15 individual mirrors are used in the scanning direction to cover the object field.

The second facets can have a monolithic embodiment. They can also be embodied by a multiplicity of individual mirrors, in particular by a multiplicity of micro-mirrors, which form groups which then act like a physical facet. These micro-mirror groups are also referred to as virtual second facets. They can form pupil facets or facets of a specular reflector.

The park positions are selected in such a way that the individual mirrors of the first facets, in the park positions, do not contribute to the illumination of the object field. In particular, they are selected in such a way that the individual mirrors of the first facets, in the park positions, do not contribute to illuminating the second facet, with which the respective first facets form an illumination channel in the predetermined target position.

The individual mirrors of the first facets can have predetermined discrete displacement positionings. They can also be continuously displaceable.

The second facets are also displaceable in accordance with an advantageous embodiment.

Simplistically, the displacement positions of a first facet, in particular of an individual mirror of same, can be described by the location of the image thereof in the region of the second facet mirror. In particular, there is a one-to-one correspondence between the tilt of an individual mirror of the first facet and the location of the image thereof in the region of the second facet mirror. Therefore, below, a position of one of the individual mirrors is understood to mean not only the displacement position thereof but also the location of the image thereof in the region of the second facet mirror. With this designation, the target positions of the first facets respectively correspond, in particular, precisely with the location of one or more of the second facets, in particular of a center of same. The park position is spaced apart from the target position. An adjacent second facet can serve as a park position. In particular, this can be the closest neighbor of the target position facet. Here, all closest neighbors are tilted, in particular, in such a way that the light of the first facet, which is "parked" thereon, is unable to reach into the object field or into the vicinity thereof. This also applies if these neighbors themselves, together with other first facets, contribute to the illumination of the object field.

The park position can also be spaced further away from the target position. In particular, it can have a distance of two, three or more facet diameters from the target position. Depending on desired properties and/or the location of the target position, it is also possible to arrange the park position outside of a region on the second facet mirror used to illuminate the object field.

The target positions for the first facets are determined in a manner dependent on the predetermined intended illumination in such a way that the totality of the illumination channels defined thus leads precisely to the predetermined intended illumination of the object field.

In accordance with one aspect of the disclosure, the individual mirrors of the first facets positioned in the park positions are displaceable from the park position into the associated target position within a switching time of at most 200 ms. The switching time is in particular at most 50 ms, in particular at most 20 ms, in particular at most 10 ms, in particular at most 5 ms, in particular at most 2 ms, in particular at most 1 ms, in particular at most 500 µs, in particular at most 200 µs, in particular at most 100 µs.

The individual mirrors of the first facets positioned in the park positions are, in particular, also referred to as fast individual mirrors. They enable a change in the intensity profile of the illumination of the object field, in particular a modulation of the dose of the illumination of the wafer in the image field between the illumination of two dies (inter-die modulation). In this case, the switching time is advantageously shorter than the time used to drive the wafer from one just exposed field to the next.

Switching times in the region of a few milliseconds or less enable an adaptation of the local dose during the exposure of the wafer (intra-die modulation).

Switching times of less than 1 ms enable a y-ReMa functionality (intra-die). To this end, in particular, provision is made for all individual mirrors of the first facets to be able to be switched off and/or on very quickly.

A y-ReMa functionality should be understood to mean that the function of a field stop which is adjustable in the y-direction, which is also referred to as reticle-masking stop (ReMa stop) or reticle-masking edge, is achievable by the displacement of the individual mirrors. Using such masking edges, it is possible to ensure that the dimensions of the actual illumination field in the object plane along the scanning direction are continuously enlarged at the start of a scanning process and reduced again at the end of the scanning process. In general, a ReMa stop, or a corresponding y-ReMa functionality which is achievable by the displaceability of the individual mirrors, renders it possible to change the dimensions of the illumination field, in particular in the y-direction. It is possible to dispense with an additional field stop, in particular an additional field stop which is adjustable and/or arranged in the direct vicinity of the reticle. As a result of this, it is possible to avoid contamination due to abrasion particles, which may occur in the case of a displacement movement of masking edges. In respect of further details about the ReMa functionality, reference is made to DE 10 2012 213 515 A1 and WO 2014/019 675 A1, both of which are integrated herewith as a component of the present application.

The flexibility of the illumination of the object field is increased by the short switching times. In particular, the illumination of the object field is improved and this renders it possible to compensate a known heterogeneity of the subsequent process steps, in particular a heterogeneity of the wafer determined in advance or otherwise known, in particular different fields (dies) on the wafer, by predictive exposure.

It is possible to embody different subsets of the individual mirrors of the first facets in such a way that they have different switching times. Then, depending on desired properties, the individual mirrors of the first facets which are suitable in each case can be positioned in park positions.

It is also possible to embody the individual mirrors of the first facets positioned in the park positions in such a way they all have an identical switching time.

In particular, the individual mirrors of the first facets can serve as dose manipulators.

In accordance with a further aspect of the disclosure, the subset of the first facets, which are positioned in park positions, makes up at most 10%, in particular 0.1% to 10%, in particular 1% to 10% of an overall number of the first facets. In particular, the subset makes up 3% to 5% of the overall number of the first facets.

According to the disclosure, it was identified that such a small portion of the individual mirrors of the first facets suffices to compensate or correct deviations in the intensity profile from a predetermined intended illumination of the object field and/or a heterogeneity of different fields on a wafer and/or between different wafers.

In accordance with a further aspect of the disclosure, each one of the target positions is completely surrounded by park positions. Expressed differently, the park positions form a ring which surrounds the associated target position. As a result of this, the displacement of the individual mirrors of the corresponding facet from the target position into the park position is simplified, in particular.

In accordance with a further aspect of the disclosure, forbidden positions are determined for a subset of the first facets, in particular for all of the first facets, in particular for the respective individual mirrors of the first facets, into which forbidden positions these may not be displaced. Such forbidden positions are also called exclusion positions. They are excluded from the totality of allowed positions. Accordingly, it is possible to predetermine a number of possible displacement paths, along which the individual mirrors of the first facets may be displaced in each case. These displacement paths can be stored in a memory, in particular of a control unit. In particular, provision can be made for determining a totality of possible displacement paths for each mirror, i.e. for each facet, and for storing these in such a memory. As a result of this, it is possible to switch individual mirrors of the first facets even during the exposure. Then, such switching processes are no longer restricted to the short dead times between the exposure of two fields (dies).

By way of example, positionings of the individual mirrors of the first facets which lead to scattered light and/or stray light in the object field are referred to as forbidden positions. If an individual mirror of a first facet is in a forbidden position, the illumination radiation reflected thereby is incident, in particular, on a second facet, from where it is imaged in a wrong region in the object field or in the vicinity thereof.

In accordance with a further aspect of the disclosure, the target positions are determined in such a way that each target position has a minimum distance from the closest forbidden position. The distance is a displacement. This can be expressed by a trajectory of the image of the respective first facet in the region of the second facet mirror, corresponding thereto. The term minimum distance should be understood in accordance with the simplification described above. It specifies the distance of the trajectory of the image, corresponding to the displacement, of the respectively displaced individual mirror of the first facet in the region of the second facet mirror in relation to the closest forbidden position. The minimum distance, $d_{min}$, between a target position and the closest forbidden position can be in particular at least one mirror diameter, in particular at least two mirror diameters, in particular at least three mirror diameters, in particular at least five mirror diameters. In particular, provision is made of arranging the target positions not adjacent to a forbidden position or of not selecting such target positions. As a result of this, the irradiation of the object field, in particular the illumination of the wafer, with stray light can be avoided.

In accordance with a further aspect of the disclosure, only a subset of the individual mirrors of the first facets is displaced during the illumination of the object field. In particular, up to 10% of the individual mirrors of the first facets, in particular at least 0.1%, in particular at least 1%, in particular 3% to 5% of the individual mirrors of the first facets are displaced during the illumination of the object field. Here, the individual mirrors of the facets can be displaced from a park position into a target position, i.e. they can be added. They can also be displaced from a target position into a park position, i.e. switched off. They can also be displaced from a target position into another target position, i.e. switched over. The individual mirrors of the first facets can, in particular, be displaced, i.e. switched, between two illuminations of the object field. In particular, they can be displaced between the illumination of two dies (inter die) or during the illumination of a single die (intra-die).

They are displaced particularly quickly, i.e. within the aforementioned switching times.

It is also possible to slowly displace a subset of the individual mirrors of the first facets during the illumination of the object field and/or between two illuminations of the object field. In particular, provision can be made for displacing the individual mirrors of the first facets not employed when illuminating the object field with a specific illumination setting into a new park position during this illumination. As a result of this, a quick subsequent displacement process can be made possible. The displacement of the individual mirrors of the first facets takes place, in particular, along one of the above-described permitted displacement paths.

In accordance with a further aspect of the disclosure, provision is made for the illumination properties of the illumination of the object field to be measured. In particular, provision is made for an actual illumination of the object field to be determined and, in the case of a deviation of the established actual illumination from a predetermined intended illumination, for this deviation to be reduced by displacing a subset of the individual mirrors of the first facets.

The actual illumination can be established continuously or at predetermined times. In particular, the intensity profile of the illumination of the object field can be corrected, in particular during the illumination of same, via a quick addition, quick switching-off or quick switching-over of individual mirrors of the first facets.

Here it is possible, in particular, to correct different parameters, for example the overall intensity, a specific intensity profile, a specific angle distribution, the uniformity of the illumination or other parameters.

In particular, provision can be made for the dose of the illumination radiation to be modulated in the region of the image field by a quick addition, quick switching-off or quick switching-over of individual mirrors of the first facets. In particular, such a modulation can be provided between the exposure of two successive fields (inter-die correction) or during the exposure of one field (intra-die correction).

In accordance with one aspect of the disclosure, provision is made for the illumination properties to be modified during the exposure of the wafer in accordance with a correction protocol determined in advance. Here, provision is made for the correction protocol to be determined in a manner dependent on a heterogeneity of the wafer, which was determined in advance or known by other ways, in particular in a manner dependent on variations between the different fields on the wafer to be exposed and/or in a manner dependent on a heterogeneity of different wafers to be exposed.

Provision can furthermore be made for the components of the projection exposure apparatus, in particular the components of the illumination device and/or the illumination optical unit and/or the projection optical unit to be measured at predetermined times or continuously. In particular, provision can be made for the individual mirrors of one or both facet mirrors to be measured. Here it is possible, in particular, to detect the tilt angles and/or the reflectivities of the individual ones of the individual mirrors. In general, it is possible to measure the properties of the far field. As a result of this, it is possible to update a model of the overall system. This renders it possible to be able to make better predictions about the illumination properties. These predictions can be taken into account in the establishment and/or adaptation when adapting the correction protocol.

Advantageously, a separate radiation source can be provided for measuring the components of the projection exposure apparatus. In particular, the measurement is not carried out with used light. However, in principle, it can also be carried out with used light.

The components of the projection exposure apparatus can be measured in each case at a time when the respective component is precisely not contributing to illuminating the reticle or to imaging the reticle in the image field, i.e. to the exposure of the wafer.

In particular, it is possible to measure the illumination properties while the substrate to be exposed, i.e. the wafer, is interchanged. In principle, it is also possible to measure the illumination properties in the dead time between the exposure of two successive fields (dies) on the wafer. In principle, it is also possible to measure the illumination properties during the exposure of the wafer.

Moreover, it is possible to readjust the precise positioning of the individual mirrors of the first facets during the illumination of the object field. In particular, this can also be provided for the switched facets. As a result of this, the precision of the positioning of same can be improved.

A further aspect of the disclosure includes providing an illumination optical unit for carrying out the method. This is achievable via an illumination optical unit including a first facet mirror with a multiplicity of first facets and a second facet mirror with a multiplicity of second facets, wherein the first facets are each displaceable into target positions in such a way that they are in each case assigned to different second facets in different target positions to form different illumination channels, and wherein at least one subset of the individual mirrors of the first facets is displaceable into park positions which are each spaced apart from an associated target position, but at most by a maximum distance $d_{max}$.

Further details and particulars of the illumination optical unit emerge from the preceding description. The individual mirrors of the first facets are displaceable from the park positions into the associated target position and/or from a target position into an associated park position and/or from one target position into another target position, particularly with the above-described short switching times.

The displacement can occur, in particular, during the exposure of the object field, in particular during the exposure of the wafer.

Further aspects of the disclosure consist in improving an illumination system for a projection exposure apparatus and a microlithographic projection exposure apparatus. These aspects are achieved by an illumination system and projection exposure apparatus including an illumination optical unit in accordance with the preceding description.

The advantages are evident from those of the illumination optical unit.

A further aspect of the disclosure includes improving a method for lithographic structuring of a wafer. This is achievable by the method according to the disclosure for lithographic structuring of a wafer. The crux of the disclosure consists in displacing a subset of the individual mirrors of the first facets from a park position into an associated target position or from a target position into an associated park position or from one target position into another target position during the structuring of the wafer.

The advantages are evident from those described above.

In accordance with one aspect of the disclosure, provision is made for the subset of the individual mirrors of the first facets to be displaced from a park position into an associated target position or from a target position into an associated park position or from one target position into another target position during a time interval between the exposure of two subsequent fields on the wafer.

In particular, the displacement occurs in accordance with a correction protocol which was determined in advance, in particular prior to the exposure of the wafer.

In order to determine the correction protocol, provision can be made, in particular, for the heterogeneity of the wafer, in particular for variations between the individual fields of the wafer to be exposed, to be established prior to the exposure of said wafer. Such data can also be predetermined differently.

Further aspects of the disclosure are to improve a method for producing a microstructured or nanostructured component, and a component produced according to the method.

These aspects are achievable by the method according to the disclosure for producing a microstructured or nanostructured component, and by the component produced accordingly.

The advantages are evident from those described above.

BRIEF DESCRIPTION OF THE DRAWINGS

Further features and details of the disclosure are evident from the description of exemplary embodiments with reference to the figures. In the figures:

FIG. 13a and FIG. 14a show sectional magnifications from FIGS. 13 and 14.

DETAILED DESCRIPTION

First of all, the basic design of a projection exposure apparatus 1 is described below on the basis of the figures.

Figure 1:
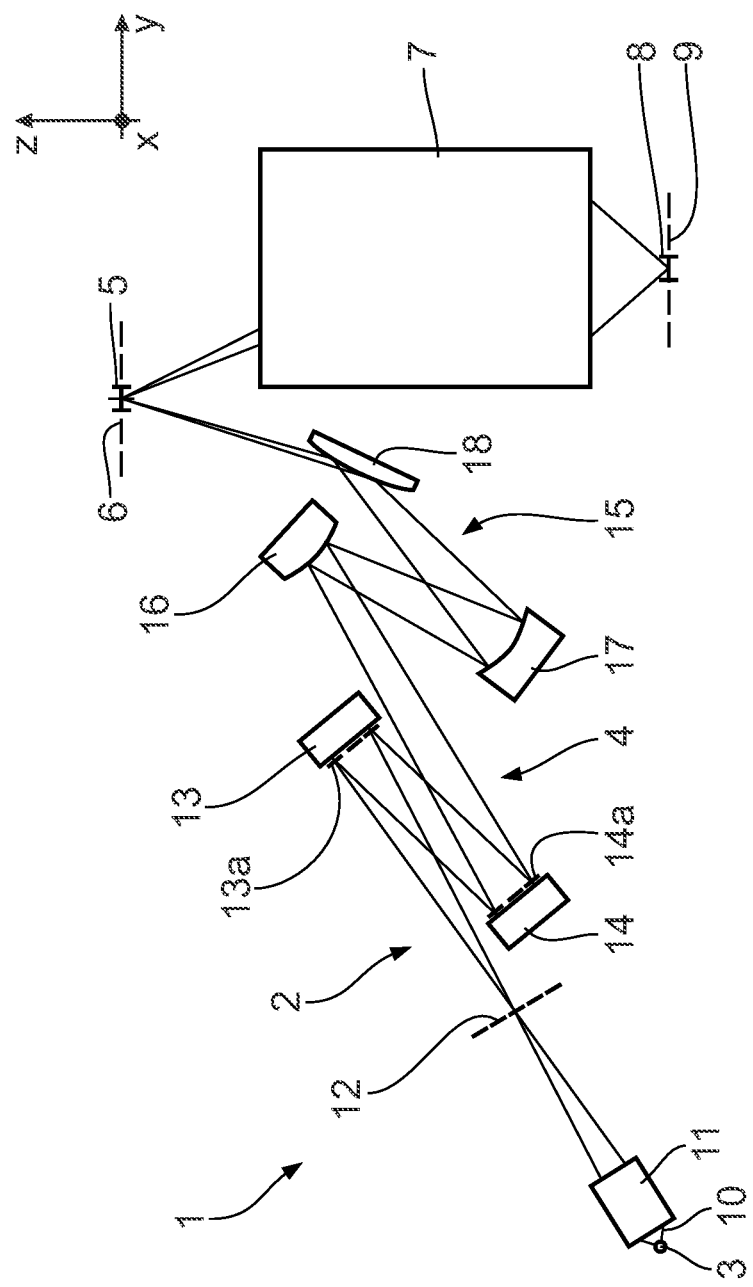
FIG. 1 shows a schematic illustration of a projection exposure apparatus for microlithography, with an illumination system and a projection optical unit in the meridional section.

FIG. 1 schematically shows a projection exposure apparatus 1 for microlithography in a meridional section. An illumination system 2 of the projection exposure apparatus 1 has, besides a radiation source 3, an illumination optical unit 4 for the exposure of an object field 5 in an object plane 6. The object field 5 can be shaped in a rectangular fashion or in an arcuate fashion with an x/y aspect ratio of 13/1, for example. In this case, a reflective reticle (not illustrated in FIG. 1) arranged in the object field 5 is exposed, said reticle bearing a structure to be projected by the projection exposure apparatus 1 for the production of microstructured or nanostructured semiconductor components. A projection optical unit 7 serves for imaging the object field 5 into an image field 8 in an image plane 9. The structure on the reticle is imaged onto a light-sensitive layer of a wafer, which is not illustrated in the drawing and is arranged in the region of the image field 8 in the image plane 9.

The reticle, which is held by a reticle holder (not illustrated), and the wafer, which is held by a wafer holder (not illustrated), are scanned synchronously in the y-direction during the operation of the projection exposure apparatus 1. Wafer and reticle can move with different speeds. Depending on the imaging scale of the projection optical unit 7, it is also possible for the reticle to be scanned in the opposite direction relative to the wafer.

With the aid of the projection exposure apparatus 1, at least one part of the reticle is imaged onto a region of a light-sensitive layer on the wafer for the lithographic production of a microstructured or nanostructured component, in particular of a semiconductor component, for example of a microchip. Depending on the embodiment of the projection exposure apparatus 1 as a scanner or as a stepper, the reticle and the wafer are moved in a temporally synchronized manner in the y-direction continuously in scanner operation or step by step in stepper operation.

The radiation source 3 is an EUV radiation source having an emitted used radiation in the range of between 5 nm and 30 nm. This can be a plasma source, for example a GDPP (Gas Discharge Produced Plasma) source or an LPP (Laser Produced Plasma) source. Other EUV radiation sources, for example those based on a synchrotron or on a free electron laser (FEL), are also possible.

EUV radiation 10 emerging from the radiation source 3 is focused by a collector 11. A corresponding collector is known for example from EP 1 225 481 A. Downstream of the collector 11, the EUV radiation 10 propagates through an intermediate focal plane 12 before being incident on a field facet mirror 13 with a multiplicity of field facets 13a. The field facet mirror 13 is arranged in a plane of the illumination optical unit 4 which is optically conjugate with respect to the object plane 6.

The EUV radiation 10 is also referred to hereinafter as used radiation, illumination light or as imaging light.

Downstream of the field facet mirror 13, the EUV radiation 10 is reflected by a pupil facet mirror 14 with a multiplicity of pupil facets 14a. The pupil facet mirror 14 lies either in the entrance pupil plane of the projection optical unit 7 or in an optically conjugate plane with respect thereto. The field facet mirror 13 and the pupil facet mirror 14 are constructed from a multiplicity of individual mirrors, which will be described in even greater detail below. In this case, the subdivision of the field facet mirror 13 into individual mirrors can be such that each of the field facets 13a which illuminate the entire object field 5 by themselves is represented by exactly one of the individual mirrors. Alternatively, it is possible to construct at least some or all of the field facets 13a using a plurality of such individual mirrors. The same correspondingly applies to the configuration of the pupil facets 14a of the pupil facet mirror 14, which are respectively assigned to the field facets 13a and which can be formed in each case by a single individual mirror or by a plurality of such individual mirrors.

The EUV radiation 10 is incident on the two facet mirrors 13, 14 at an angle of incidence that is less than or equal to 25°, measured in relation to the normal of the mirror surface. The EUV radiation 10 therefore impinges on the two facet mirrors 13, 14 in the range of normal incidence operation. Impingement with grazing incidence is also possible. The pupil facet mirror 14 is arranged in a plane of the illumination optical unit 4 which constitutes a pupil plane of the projection optical unit 7 or is optically conjugate with respect to a pupil plane of the projection optical unit 7. With the aid of the pupil facet mirror 14 and an imaging optical assembly in the form of a transfer optical unit 15 having mirrors 16, 17 and 18 designated in the order of the beam path for the EUV radiation 10, the field facets of the field facet mirror 13 are imaged into the object field 5 in a manner being superimposed on one another. The last mirror 18 of the transfer optical unit 15 is a grazing incidence mirror. The transfer optical unit 15 together with the pupil facet mirror 14 is also referred to as a sequential optical unit for transferring the EUV radiation 10 from the field facet mirror 13 towards the object field 5. The illumination light 10 is guided from the radiation source 3 towards the object field 5 via a plurality of illumination channels. Each of these illumination channels is assigned a field facet 13a of the field facet mirror 13 and a pupil facet 14a of the pupil facet mirror 14, said pupil facet being disposed downstream of the field facet. The individual mirrors of the field facet mirror 13 and of the pupil facet mirror 14 can be tiltable by an actuator system, such that a change in the assignment of the pupil facets 14a to the field facets 13a can be achieved in accordance with a changed configuration of the illumination channels. Different illumination settings result, which differ in the distribution of the illumination angles of the illumination light 10 over the object field 5.

In order to facilitate the explanation of positional relationships, use is made below of, inter alia, a global Cartesian xyz-coordinate system. The x-axis runs perpendicular to the plane of the drawing towards the observer in FIG. 1. The y-axis runs towards the right in FIG. 1. The z-axis runs upwards in FIG. 1.

In selected figures from among the subsequent figures, a local Cartesian xyz-coordinate system is depicted, wherein the x-axis runs parallel to the x-axis according to FIG. 1 and the y-axis together with said x-axis spans the optical area of the respective optical element.

Figure 2:
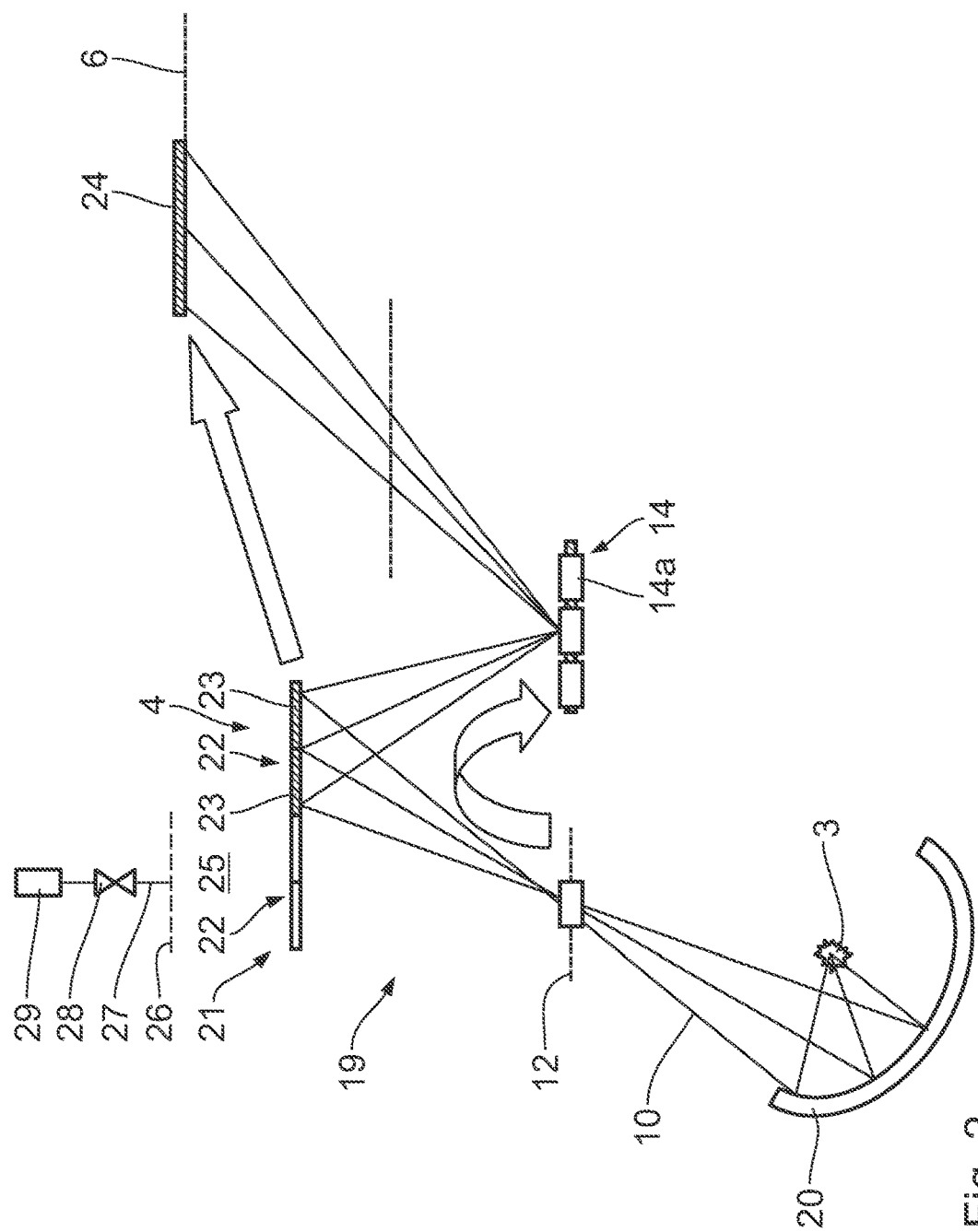
FIG. 2 shows an embodiment of an illumination system of a projection exposure apparatus including a mirror array (MMA) and a pupil facet mirror illuminated by the latter, FIG. 3 schematically shows an exemplary plan view of the pupil facet mirror according to FIG. 2 with a pupil facet illumination which corresponds to an illumination setting, FIG. 4 schematically shows the illumination system in accordance with FIG. 2 with a channel assignment of the mirror array to the pupil facet mirror which is generable by displacement of the mirror elements.

FIG. 2 shows an alternative configuration of an illumination system 19 for the projection exposure apparatus 1. Components corresponding to those which have already been explained above with reference to FIG. 1 bear the same reference numerals and will not be discussed in detail again.

Used radiation 10 emerging from the radiation source 3, which can be embodied as an LPP source, is firstly collected by a first collector 20. The collector 20 can be an ellipsoid mirror which images the radiation source 3 into the intermediate focal plane 12 or focuses the light from the radiation source 3 onto the intermediate focus in the intermediate focal plane 12. The collector 20 can be operated in such a way that the used radiation 10 impinges on it at angles of incidence near 0°. The collector 20 is then operated near normal incidence and is therefore also referred to as a normal incidence (NI) mirror. A collector operated with grazing incidence can also be used instead of the collector 20.

A field facet mirror 21 in the form of a multi- or micro-mirror array (MMA) as an example of an optical assembly for guiding the used radiation 10, that is to say the EUV radiation beam, is disposed downstream of the intermediate focal plane 12. The multi-mirror or micro-mirror array (MMA) is also referred to as a mirror array 22 in the following text. The field facet mirror 21 is embodied as a microelectromechanical system (MEMS). It has a multiplicity of individual mirrors arranged in a matrix-like manner in rows and columns in an array. In the following text, the individual mirrors are also referred to as mirror elements 23. The mirror elements 23 are designed to be tiltable by an actuator system, as will be explained below. Overall, the field facet mirror 21 has approximately 100 000 of the mirror elements 23. Depending on the size of the mirror elements 23, the field facet mirror 21 can also have for example 1000, 5000, 7000 or else hundreds of thousands of mirror elements 23, for example 500 000.

A spectral filter can be arranged upstream of the field facet mirror 21 and separates the used radiation 10 from other wavelength components of the emission of the radiation source 3 that are not usable for the projection exposure. The spectral filter is not illustrated.

The field facet mirror 21 is impinged on by used radiation 10 having a power of 840 W and a power density of 6.5 kW/m$^2$. The used radiation 10 can also have a different power and/or power density.

The entire individual mirror array of the facet mirror 21 has a diameter of 500 mm and it is designed in a close packed manner with the mirror elements 23. The surface coverage, which is also referred to as degree of filling or integration density, of the complete field facet array by the mirror elements 23 is at least 70%, in particular at least 80%, in particular at least 85%, in particular at least 90%, in particular at least 95%. Insofar as a field facet 21a is realized by exactly one mirror element 23 in each case, the mirror elements 23 represent the shape of the object field 5, apart from a scaling factor. The facet mirror 21 can be formed from 500 mirror elements 23 each representing a field facet 21a and having a dimension of approximately 5 mm in the y-direction and 100 mm in the x-direction. As an alternative to the realization of each field facet 21a by exactly one mirror element 23, each of the field facets 21a can be formed by groups of smaller mirror elements 23. A field facet 21a having dimensions of 5 mm in the y-direction and of 100 mm in the x-direction can be constructed e.g. via a 1×20 array of mirror elements 23 having dimensions of 5 mm×5 mm through to a 10×200 array of mirror elements 23 having dimensions of 0.5 mm×0.5 mm. In accordance with the disclosure, the assignment of the mirror elements 23 to a field facet 21a is flexible. In particular, the field facets 21a are only defined by a suitable actuation of the mirror elements 23. In particular, the form of the mirror elements 23 can be independent of the form of the macroscopic field facets.

The used light 10 is reflected by the mirror elements 23 of the facet mirror 21 towards the pupil facet mirror 14. The pupil facet mirror 14 has approximately 2000 static pupil facets 14a. The latter are arranged alongside one another in a plurality of concentric rings, such that the pupil facet 14a of the innermost ring is fashioned in a sector-shaped manner and the pupil facets 14a of the rings directly adjacent thereto are fashioned in a ring-sector-shaped manner. In a quadrant of the pupil facet mirror 14, 12 pupil facets 14a can be present alongside one another in each of the rings. Each one of the pupil facets 14a can be embodied as a mirror array 22.

The used light 10 is reflected by the pupil facets 14a towards a reflective reticle 24 arranged in the object plane 6. The projection optical unit 7 then follows, as explained above in connection with the projection exposure apparatus according to FIG. 1.

A transfer optical unit 15 can once again be provided between the facet mirror 14 and the reticle 24, as explained above in connection with the illumination optical unit 4 according to FIG. 1.

Figure 3:
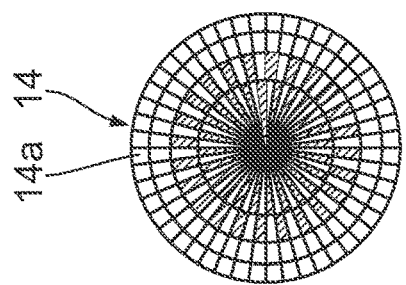

FIG. 3 shows by way of example an illumination of the pupil facets 14a of the pupil facet mirror 14 by which the conventional illumination setting according to FIG. 2 can approximately be achieved. In the two inner pupil facet rings of the pupil facet mirror 14, every second one of the pupil facets 14a is illuminated in the circumferential direction. This alternating illumination representation in FIG. 3 is intended to symbolize that the filling density realized in the case of this illumination setting is lower than in the case of an annular illumination setting by a factor of 2. A homogeneous illumination distribution is likewise striven for in the two inner pupil facet rings, although with an occupation density that is lower by a factor of 2. The two outer pupil facet rings illustrated in FIG. 3 are not illuminated.

Figure 5:
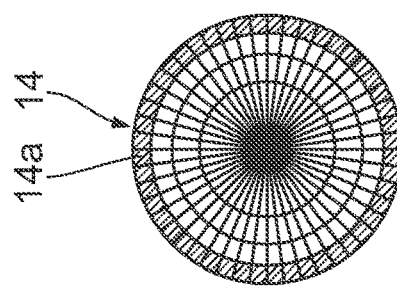
FIG. 5 shows a schematic plan view of the pupil facet mirror in accordance with FIG. 3 with a pupil facet illumination which corresponds to an annular illumination setting.
Figure 4:
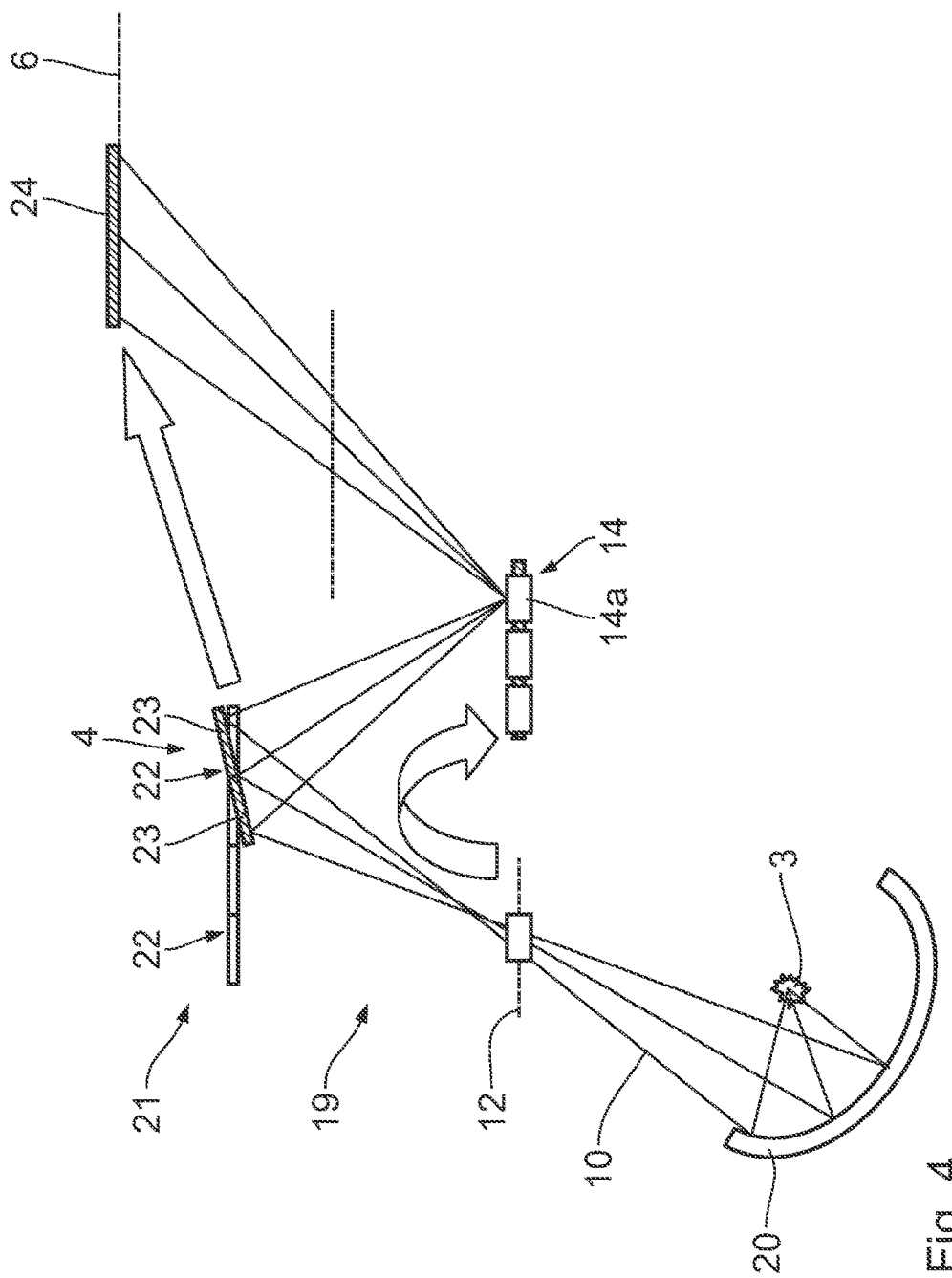

FIG. 4 schematically shows the conditions in the illumination optical unit 4, provided an annular illumination setting is set there. The mirror elements 23 of the field facet mirror 21 are tilted by actuators with the aid of actuators yet to be explained in more detail below in such a way that an outer ring of the ring-sector-shaped pupil facet 14a is illuminated by the used light 10 on the pupil facet mirror 14. This exemplary illumination of the pupil facet mirror 14 is depicted in FIG. 5. The tilt of the mirror elements 23 for generating this illumination is indicated in an exemplary manner in FIG. 4 using the example of one of the mirror elements 23.

For the purposes of changing the illumination settings in accordance with FIGS. 2 to 5, the mirror elements 23 can be pivoted about a tilt angle. In particular, they are pivotable about a tilt angle in the region of at least ±50 mrad, in particular at least ±80 mrad, in particular ±100 mrad. Here, the respective tilt position can be maintained with an accuracy of at least 0.2 mrad, in particular at least 0.1 mrad, in particular at least 0.05 mrad, in particular at least 0.03 mrad.

The mirror elements 23 carry multilayer coatings for optimizing the reflectivity thereof at the wavelength of the used radiation 10. The temperature of the multilayer coatings should not exceed 425 K during the operation of the projection exposure apparatus 1. This is achieved by a construction of the mirror elements 23 which is explained in an exemplary manner below. As is indicated schematically in FIG. 2, the mirror elements 23 of the illumination optical unit 4 are housed in an evacuable chamber 25. FIG. 2 only schematically indicates a boundary wall 26 of the evacuable chamber 25. The chamber 25 communicates with a vacuum pump 29 via a fluid line 27, in which a shutoff valve 28 is accommodated. The operating pressure in the evacuable chamber 25 is a few Pa (partial pressure $H_2$). All other partial pressures are significantly below $10^{-7}$ mbar.

The mirror elements 23 are arranged in a substrate 30. The latter is mechanically connected to a mirror body 32 by way of a thermal conduction portion 31. An articulation body 33 which permits a tilt of the mirror body 32 relative to the substrate 30 is part of the thermal conduction portion 31. The articulation body 33 can be embodied as a flexure which permits a tilt of the mirror body 32 about defined tilt degrees of freedom, for example about one or two tilt axes, which, in particular, are arranged perpendicular to one another. The articulation body 33 has an outer holding ring 34, which is fastened to the substrate 30. Furthermore, the articulation body 33 has an inner holding body 35 connected to the outer holding ring 34 in an articulated manner. Said holding body is arranged centrally under a reflection surface 36 of the mirror element 23. A spacer 37 is arranged between the central holding body 35 and the reflection surface 36.

Heat, in particular heat generated by absorption of the incident used radiation 10, deposited in the mirror body 32 is dissipated by way of the thermal conduction portion 31, namely by way of the spacer 37, the central holding body 35 and the articulation body 33, as well as the outer holding ring 34, toward the substrate 30. A thermal power density of at least 10 kW/m², in particular at least 30 kW/m², in particular at least 50 kW/m² can be dissipated to the substrate 30 by way of the thermal conduction portion 31. The thermal power dissipated to the substrate 30 can be at least 2.5 mW, in particular at least 7.5 mW, in particular at least 12.5 mW for each mirror element 23. Alternatively, the thermal conduction portion 31 is embodied to dissipate thermal power density of at least 1 kW/m² or a power, taken up by the mirror body 32, of at least 0.25 mW to the substrate 30. In addition to absorbed power from the used radiation 10 from the radiation source 3, the taken-up power can e.g. also be taken-up electric power.

An actuator pin 38 is arranged on the holding body 35 on the side thereof opposite to the spacer 37. The actuator pin 38 can have a smaller external diameter than the spacer 37. The actuator pin 38 can also have the same diameter as, or a greater diameter than, the spacer 37.

Figure 6:
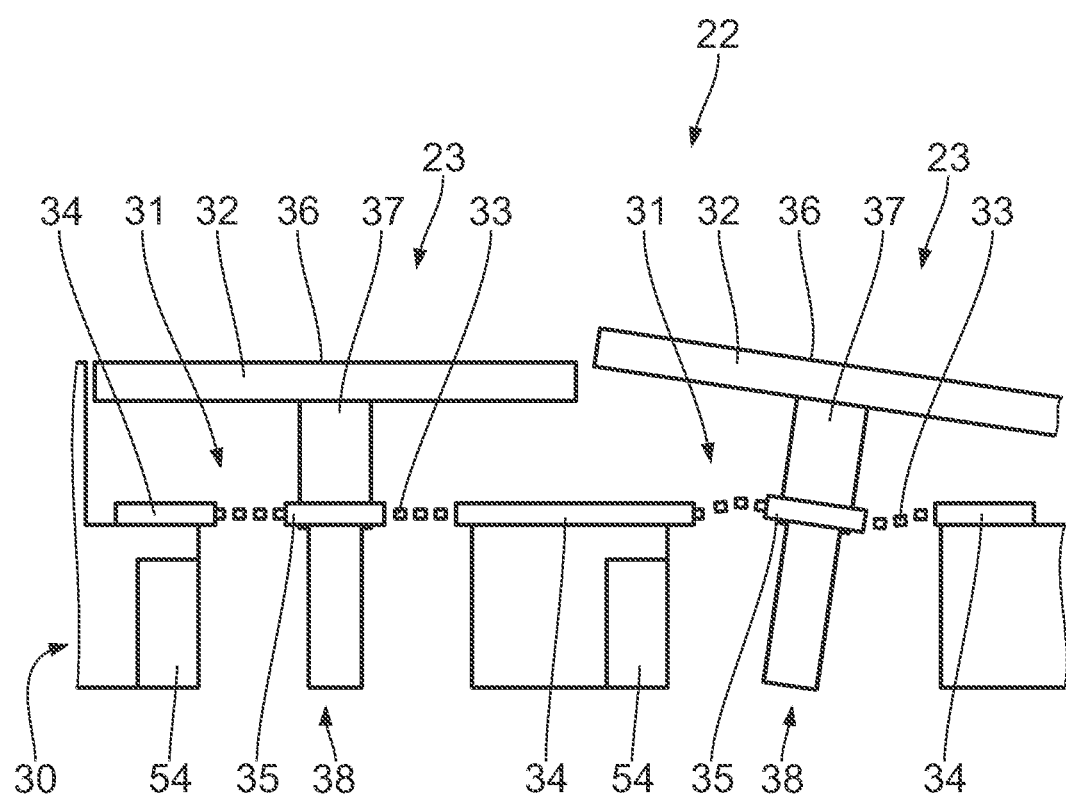
FIG. 6 shows a schematic illustration of two mirror elements of the mirror array in accordance with FIGS. 2 and 4 lying next to one another.

The substrate 30 forms a sleeve surrounding the actuator pin 38. Integrated into the sleeve are a total of three electrodes 54 in each case, said electrodes being arranged electrically insulated from one another and in each case extending over just under 120° in the circumferential direction. The electrodes 54 constitute counter-electrodes to the actuator pin 38 embodied as an electrode pin in this embodiment. Here, in particular, the actuator pin 38 can be embodied as a hollow cylinder. In principle, it is also possible to provide a different number of electrodes 54 per actuator pin 38. In particular, four or more electrodes 54 can be provided per actuator pin 38. By generating a potential difference between one or more of the electrodes 54 and the actuator pin 38, it is possible to generate an electrostatic force on the actuator pin 38, which force, as depicted in an exemplary manner in the right half of FIG. 6, may lead to deflection of the mirror element 23.

In particular, the substrate 30 can be formed from a silicon wafer, on which a whole array of mirror elements 23 is arranged.

The actuator pin 38 can also be part of a Lorentz actuator. In this case, a permanent magnet is arranged at the free end of the actuator pin 38. The permanent magnet can be aligned in such a way that a north pole and a south pole of same are arranged next to one another along the actuator pin 38. By way of example, such a Lorentz actuator is known from U.S. Pat. No. 7,145,269 B2. It can be produced in a batch process as a microelectromechanical system (MEMS). By way of such a Lorentz actuator, it is possible to obtain a force density of 20 kPa. The force density is defined as the ratio of the actuator force to that area of the actuator over which the actuator force acts. The cross section of the actuator pin 38 can serve as a measure for the side face of the actuator, to be considered per se, by which the actuator force acts.

As an alternative to the embodiment as Lorentz actuators, the actuators for tilting the mirror elements 23 can be embodied as reluctance actuators, e.g. in the style of WO 2007/134 574 A, or as piezo-actuators. By way of a reluctance actuator, it is possible to obtain a force density of 50 kPa. Depending on the embodiment, a force density of 50 kPa to 1 MPa can be achieved by way of a piezo-actuator.

Reference is made to WO 2010/049 076 A2 in respect of further details, in particular about the arrangement of the individual mirrors 23 in the substrate 30 and the pivotability thereof via the actuators, as well as the embodiment of the articulation bodies and thermal conduction portions 31.

The mirror array 22 has in particular at least 4, in particular at least 16, in particular at least 64, in particular at least 256, in particular at least 1024, in particular at least 1296, in particular at least 1600 mirror elements 23. These are preferably arranged in a rectangular matrix, in particular a square matrix. The mirror elements 23 have a square cross section. In principle, they can also have a triangular, rectangular or hexagonal embodiment. They are embodied as parquet elements. The totality of the mirror elements 23 forms a parqueting of an overall reflection surface of the mirror array 22. The parqueting is a tessellation, in particular. The mirror elements 23 are arranged in a particularly tightly packed manner. In particular, the mirror array has a degree of filling of at least 0.85, in particular at least 0.9, in particular at least 0.95. Here, the degree of filling, which is sometimes also referred to as integration density, denotes the ratio of the overall reflection surface, i.e. the sum of the reflection surfaces 36 of all mirror elements 23 of the mirror array 22, to the overall area of the array 22.

The reflection surface 36 of the mirror elements 23 has a planar embodiment. In principle, it can also have a concave or convex embodiment or an embodiment as a free-form surface.

The reflection surface 36 of the mirror elements 23 is provided, in particular, with a (multilayer) coating for optimizing the reflectivity thereof at the wavelength of the used radiation 10. In particular, the multilayer coating enables the reflection of used radiation 10 with a wavelength in the EUV range, in particular in the range from 5 nm to 30 nm.

The mirror array 22 has a modular embodiment. In particular, it is embodied in such a way as a tiling element that the parqueting of the overall reflection surface of the mirror array 22 is expandable as desired by tiling a plurality of such tiling elements, i.e. a plurality of mirror arrays 22 with an identical embodiment. Here, the different terms "parqueting" and "tiling" are only used to distinguish between the parqueting of the overall reflection surface of an individual mirror array 22 by the mirror elements 23 and that of a multi-mirror array by the plurality of mirror arrays 22. They both denote a gap-free and overlap-free coverage of a simple contiguous region in a plane. Even if the coverage of the overall reflection surface is not perfectly without gaps in the present case, which is reflected by a degree of filling <1, reference is still made below to a parqueting or tiling if the degree of filling has the value specified above, in particular at least 0.85.

The mirror elements 23 are held by the substrate 30. The substrate 30 has an edge region 42 extending in the direction perpendicular to the surface normal 41. In particular, the edge region 42 is arranged in a manner encircling the mirror elements 23. In the direction perpendicular to the surface normal 41, it has a width b, in particular a maximum width b, of at most 5 mm, in particular at most 3 mm, in particular at most 1 mm, in particular at most 0.5 mm, in particular at most 0.3 mm, in particular at most 0.2 mm. Therefore, the overall area of the mirror array 22 projects by at most 5 mm, in particular at most 3 mm, in particular at most 1 mm, in particular at most 0.5 mm, in particular at most 0.3 mm, in particular at most 0.2 mm over the overall reflection surface, i.e. over the outer edge thereof, in the direction perpendicular to the surface normal 41.

The overall area of the mirror array 22 lies in the range from 1 mm×1 mm to 50 mm 50 mm, in particular in the range from 10 mm×10 mm to 25 mm×25 mm. In principle, other dimensions are also possible. In particular, it can also deviate from the square form. The protrusion of the overall area of the mirror array 22 over the overall reflection surface thereof is also referred to as a side or lateral overhead. The ratio of the lateral overhead to the overall extent in the same direction is at most 0.1, in particular at most 0.05, in particular at most 0.03, in particular at most 0.02, in particular at most 0.01. The lateral protrusion is therefore smaller than the overall extent of the overall reflection surface of the mirror array 22 by at least one order of magnitude.

In addition to the mirror array 22, the optical component 40 includes a carrying structure 43. The carrying structure 43 is arranged offset from, in particular adjacent to, the mirror array 22 in the direction of the surface normal 41. It preferably has a cross section which is identical to that of the substrate 30 of the mirror array 22. In general, it projects by at most 5 mm, in particular at most 3 mm, in particular at most 1 mm, in particular at most 0.5 mm, in particular at most 0.1 mm, in particular at most 0.05 mm, in particular not at all, over the substrate 30 and hence over the overall area of the mirror array 22 in the direction perpendicular to the surface normal 41. Such an arrangement is also referred to as an arrangement according to the "shadow casting principle". This is understood to mean, in particular, that the carrying structure 43 is arranged completely within a parallel projection of the overall area of the mirror array 22 in the direction of the surface normal 41.

The carrying structure 43 is made of a ceramics-containing and/or silicon-containing and/or aluminum-containing material. This enables the dissipation of heat from the mirror array 22 with, at the same time, high mechanical stability. Examples for the material of the carrying structure 43 are ceramic materials, silicon, silicon dioxide, aluminum nitrite and aluminum oxide, for example $Al_2O_3$ ceramic material. In particular, the carrying structure 43 can be produced from a wafer. The carrying structure 43 can also be produced from quartz or a glass wafer, which is provided with so-called thermal vias.

The carrying structure 43 has a cutout 44 open on one side. The cutout 44 forms a receiving space, open on one side, for receiving further functional constituents. On the side thereof opposite to the mirror array 22, the cutout 44 is delimited by a base 45 of the carrying structure in the direction of the surface normal 41. Laterally, i.e. in the direction perpendicular to the surface normal 41, it is delimited by an edge region 46 of the carrying structure 43. In a direction perpendicular to the surface normal 41, the edge region 46 has a width $b_C$. Here, $0.5 \times b \leq b_C \leq 2 \times b$ applies. In particular, the edge region 46 of the carrying structure 43 can be just as wide as the edge region 42 of the substrate 30, $b=b_C$.

The carrying structure 43 is mechanically connected to the mirror array 22 only in this edge region 46. A sealing element 61 is arranged between the carrying structure 43 and the mirror array 22. The sealing element 61 is integrated into a metallization on the rear side 48 of the substrate 30 of the mirror array 22. It can also be embodied as a sealing ring arranged on the edge region 46 of the carrying structure 43. The receiving space formed by the cutout 44 is therefore encapsulated, i.e. sealed in a liquid-tight, in particular gas-tight manner, at least during the production of the component 40. In principle, it is possible to arrange the ASICs 52 in an encapsulated manner, i.e. sealed in a liquid-tight, in particular gas-tight manner. To this end, a continuous intermediate layer (not depicted in the figures) between the mirror array 22 and the ASICs 52 still is present.

A multiplicity of signal lines 47 are integrated into the carrying structure 43. The signal lines 47 are embodied as vertical interconnect accesses, so-called "vias". They are bonded directly at the rear side 48 of the mirror array 22 opposite to the reflection surfaces 36. They are moreover provided with contact elements 50 on the side opposite to the mirror array 22, i.e. on the rear side 49 of the carrying structure 43. Each component 40 can have more than 30, in particular more than 50, in particular more than 70 signal lines 47. These signal lines 47 serve, inter alia, to supply power to a control device 51 for controlling the displacement of the mirror elements 23. The control device 51 for controlling the displacement of the mirror elements 23 is integrated into the carrying structure 43. In particular, it is embodied as an application-specific integrated circuit 52 (ASIC). The component 40 can have a plurality of ASICs 52. It includes at least one ASIC 52, in particular at least two, in particular at least four, in particular at least nine, in particular at least 16, in particular at least 25, in particular at least 100 ASICs 52. Here, each one of the ASICs 52 is signal connected to at least one mirror element 23, in particular to a plurality of mirror elements 23, in particular to at least two, in particular at least four, in particular at least eight mirror elements 23. In respect of details about controlling the actuators for displacing the mirror elements 23, reference is made to WO 2010/049 076 A2.

The signal lines 47 to the ASICs 52 run from the rear side 49 of the carrying structure 43 through the carrying structure 43 to the rear side 48 of the mirror array 22, from there they run along the rear side 48 of the mirror array 22 and run to the ASICs 52 by way of a flip chip contact 53. The signal lines to the integrated or local driver electronics are therefore guided on the rear side 48 of the mirror arrays 22. A control voltage generated on the ASIC 52 for controlling the displacement of one of the mirror elements 23 is brought by way of a further flip chip contact 53 onto the rear side 48 of the mirror array 22 to a corresponding electrode 54. Therefore, all electrical contacting of one of the ASICs 52 is on the same side of the ASIC 52. In particular, said contacting is situated on the side of the ASIC 52 facing the mirror array 22. Two-sided contacting and through-contacting of the ASIC 52, which, in principle, is likewise possible, are avoided hereby. A further advantage of such an arrangement of the signal lines 47 consists of the fact that all signal lines 47 can be laid on the rear side 48 of the mirror array 22 in a single metal layer. This leads to simplification of the production process and hence to a reduction in the production costs.

Moreover, the signal lines 47 are embodied and arranged in such a way that specific signal lines 47 are combined on the front side 43a of the carrying structure 43, facing the mirror array 22, and/or on the rear side 49 of the same. By way of example, the signal lines 47 for the feed voltages of the ASICs 52 are combined. This leads to signal reduction in the region of the carrying structure 43. In particular, the signal reduction in the region of the carrying structure 43 is at least 10:1.

On the rear side 49 of the carrying structure 43, the component 40 has an electrical interface 55. In particular, the interface 55 is completely arranged on the rear side 49 of the carrying structure 43 lying opposite the mirror array 22. Lateral contacts, which are possible in principle, can be completely dispensed with. Therefore, the "shadow casting principle" is also observed in the signal flow (cf. FIG. 7). Consequently, both the component parts of the component 40 and also the signal and heat flow in the latter are oriented in the direction of the surface normal 41. Therefore, the component 40 has a vertical integration.

Figure 7:
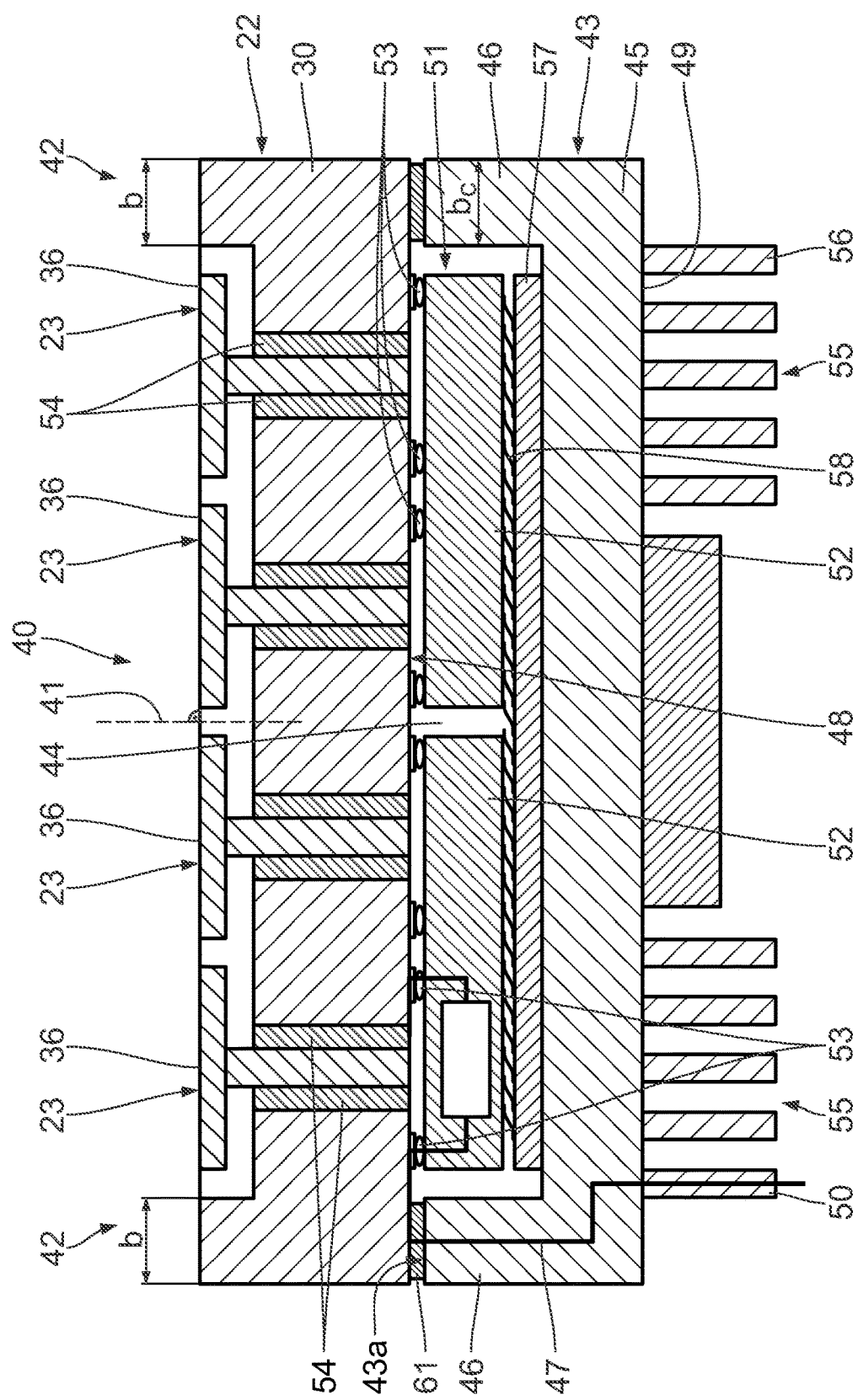
FIG. 7 shows a schematic cross section through an embodiment of the optical component with a mirror array (MMA)

In the case of the embodiment illustrated in FIG. 7, the electrical interface 55 has a multiplicity of contact pins 56 applied to the rear side 49 of the carrying structure 43. As an alternative thereto, the contact elements 50 of the electrical interface 55 can also be embodied in planar fashion.

As an alternative thereto, the contact elements 50 of the electrical interface 55 can also be embodied as integrated pins in the carrying structure 43. In this case, vertical interconnect accesses (vias) in the carrying structure 43, which are embodied e.g. as through-bores filled with gold, are partly exposed in the region of the rear side 49 of the carrying structure 43. In particular, this can be achieved by etching away part of the material of the carrying structure 43 surrounding the vias. The exposed piece of the vias now forms the contact element 50.

Furthermore, the carrying structure 43 includes a ferromagnetic element 57. It includes in particular at least one ferromagnetic element 57. A plurality of ferromagnetic elements 57 can also be provided. The ferromagnetic element 57 is embodied as a metal plate or as a metal foil. The ferromagnetic element 57 can also be embodied as a permanent magnetic element. In accordance with the embodiments illustrated by way of example in FIGS. 7 and 9, the metal foil 57 is arranged in the cutout 44 of the carrying structure 43. In particular, said metal foil is fixedly connected to the carrying structure 43. It can be bonded onto the carrying structure 43, for example. It can also be adhesively bonded. Direct electrolytic deposition of a ferromagnetic metal layer onto the carrying structure 43 as a ferromagnetic element 57 is likewise possible. The metal foil 57 can, as illustrated by way of example in FIG. 10, also be arranged on the rear side 49 of the carrying structure 43. In principle, a combination of the arrangement of the metal foil 57 in the cutout 44 and on the rear side 49 of the carrying structure 43 is also possible.

In particular, the metal foil 57 can be arranged between the ASICs 52 and the base 45 of the carrying structure 43. In so doing, it can also form a thermal interface between the ASICs 52 and the carrying structure 43. In this case, it is advantageous for the metal foil 57 to be embodied as a soft, corrugated metal foil, that is to say as a so-called spring foil. Moreover, an additional heat-conducting element 58 can be arranged between the ASICs 52 and the base 45 of the carrying structure 43, in particular between the ASICs 52 and the metal foil 57. A plurality of heat-conducting elements can also be provided. The ASICs 52 can, in particular, be embedded at least partly into the heat-conducting element within the cutout 44. Such a thermal interface between the ASICs 52 and the base 45 of the carrying structure 43 improves the vertical integration of the heat flow through the component 40. Heat from the mirror array 22 and in particular from the ASICs 52 can in this case be dissipated directly, that is to say substantially in the direction of the surface normal 41, to the base 45 of the carrying structure 43 and through the latter.

Further aspects of the disclosure are described below with reference to FIGS. 8 to 15.

Figure 8:
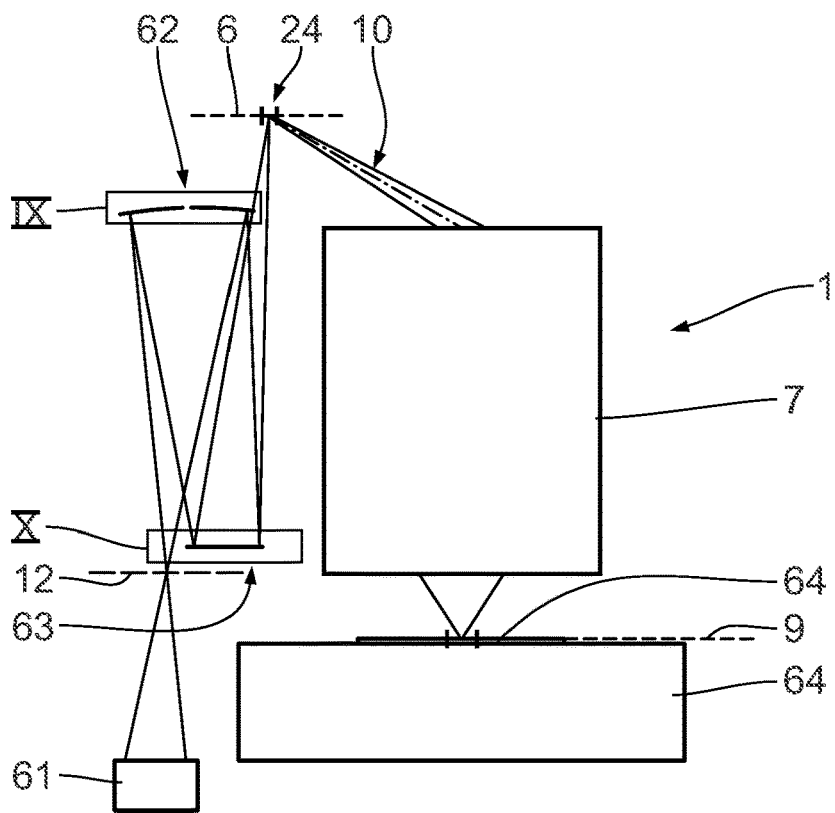
FIG. 8 shows a schematic illustration of an exemplary beam path in a projection exposure apparatus.

FIG. 8 once again schematically depicts a beam path of the illumination radiation 10 of the projection exposure apparatus 1. In FIG. 8, the radiation source 3 and the collector 11 are depicted together as an illumination device 61.

Of the illumination optical unit, a first facet mirror 62 and a second facet mirror 63 are depicted merely in the exemplary form. The first facet mirror 62 can be the field facet mirror 13, in particular. The second facet mirror 63 can be the pupil facet mirror 14, in particular. However, it is also possible to arrange the second facet mirror 63 at a distance from a pupil plane of the illumination optical unit. In this case, it is referred to, in general, as a specular reflector.

FIG. 8 schematically depicts the projection optical unit 7. The projection optical unit 7 can include six mirrors $M_1$ to $M_6$. The projection optical unit 7 can also include a different number of mirrors $M_i$. In particular, it can include two, three, four, five, six, seven, eight or more mirrors.

Furthermore, FIG. 8 schematically depicts a wafer 64 arranged in the image plane 9. The wafer 64 is held by a wafer holder 65. In particular, it is displaceable via the wafer holder 65.

Figure 9:
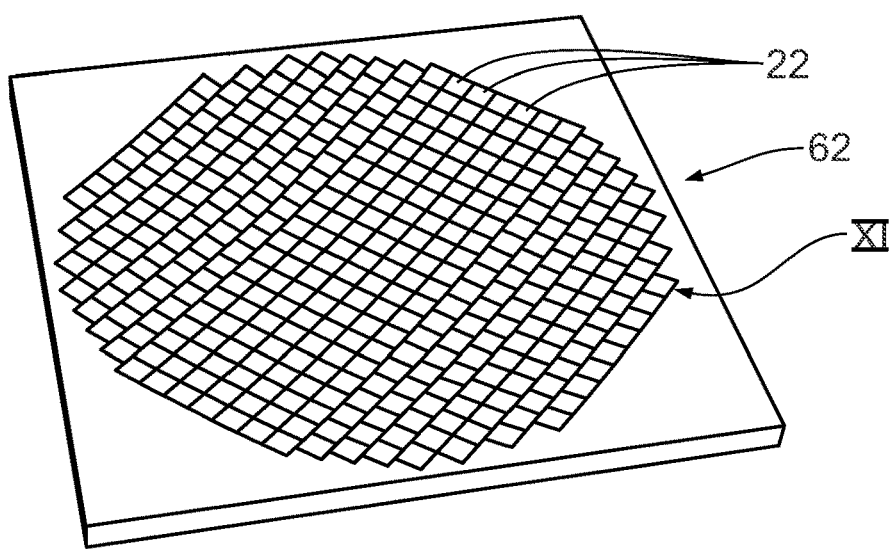
FIG. 9 shows a sectional magnification of the region IX with the first facet mirror of the illumination optical unit of the projection exposure apparatus in accordance with FIG. 8.

FIG. 9 schematically depicts an exemplary embodiment of the first facet mirror 62. The first facet mirror 62 includes a multiplicity of mirror arrays 22. The depicted arrangement of the mirror arrays 22 should be understood to be exemplary. The actual number of the mirror arrays 22 of the first facet mirror 62 can be substantially larger. It can be up to several thousand.

The mirror arrays 22 are arranged in parallel lines.

Figure 10:
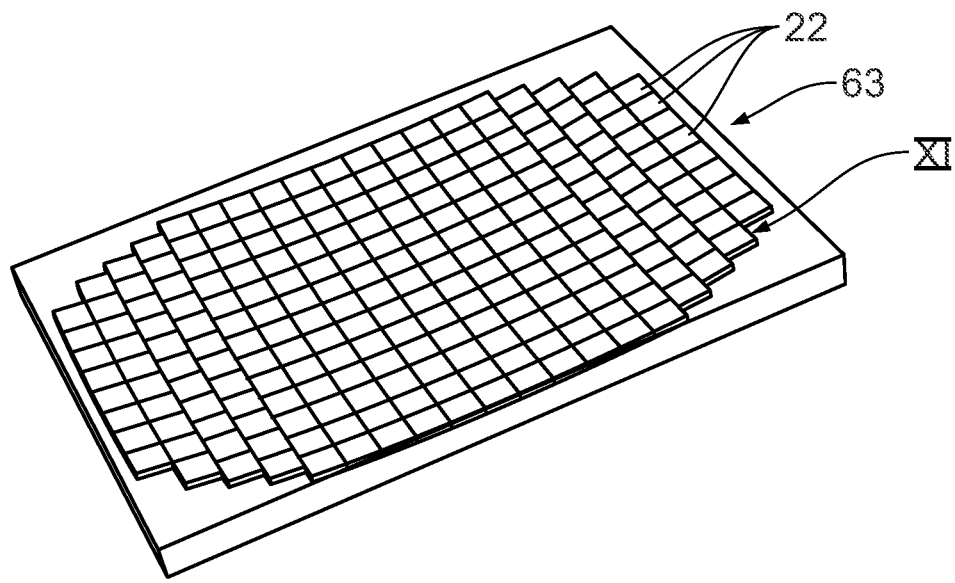
FIG. 10 shows a sectional magnification of the region X with the second facet mirror of the illumination optical unit of the projection exposure apparatus in accordance with FIG. 8.

Accordingly, FIG. 10 schematically depicts an exemplary embodiment of the second facet mirror 63. The second facet mirror 63 includes a multiplicity of mirror arrays 22. The mirror arrays 22 are arranged in parallel lines. The actual number of the mirror arrays 22 of the first facet mirror 62 can be substantially larger. It can be up to several thousand.

Figure 11:
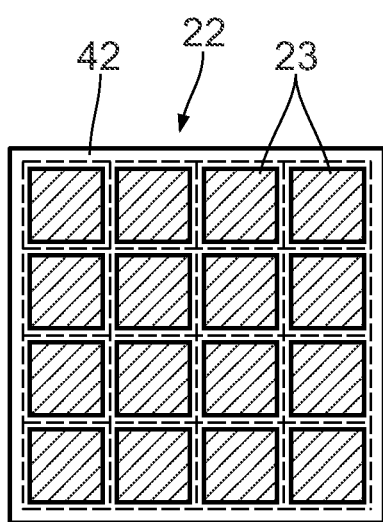
FIG. 11 shows a sectional magnification of the region XI of one of the micro-mirror arrays of the facet mirror in accordance with FIG. 9.

FIG. 11 depicts one of the mirror arrays 22 in a magnified manner, once again schematically. In respect of the structural details of the mirror array 22, reference is made to the embodiment depicted in FIG. 7 and described above. However, it should be noted once again that the number of micro-mirrors 23 of the mirror array 22 can also be substantially larger than depicted in FIG. 11.

The mirror arrays 22 are embodied in a modular, in particular brick-like manner. They are also referred to as bricks.

Preferred embodiments of the mirror array 22 are described below.

According to the disclosure, it was identified that not all individual mirrors 23 of the mirror array 22 need to meet the same desired properties. In particular, it can be advantageous to subdivide the individual mirrors 23 of the mirror array 22 into two groups, wherein the individual mirrors 23 of the different groups fulfill different functions. For clarification purposes, the individual mirrors 23 of the first group are depicted in a hatched manner in FIG. 12, while the individual mirrors 23 of the second group are depicted without hatching. In the exemplary embodiment depicted in an exemplary manner in FIG. 12, the individual mirrors 23 of the second group are arranged along one of the diagonals of the mirror array 22. In general, they are arranged along one or two or more straight lines.

From a structural point of view, the individual mirrors 23 of the first group and the individual mirrors 23 of the second group can be identical. The groups of the individual mirrors 23 can be disjoint. However, it is also possible for one or more of the individual mirrors 23 to belong to both groups. In particular, they can be displaceable in both a precise and a quick manner. In particular, it is possible to dynamically set the assignment of the individual mirrors 23 to the different groups. Here, it can be particularly advantageous to initially assign a subset of the individual mirrors 23 to the second group such that they are displaceable with a very short switching time but, after displacement has taken place, to assign these individual mirrors 23 back to the first group such that the positioning thereof can be controlled, in particular regulated, in a very precise and stable manner.

Figure 12:
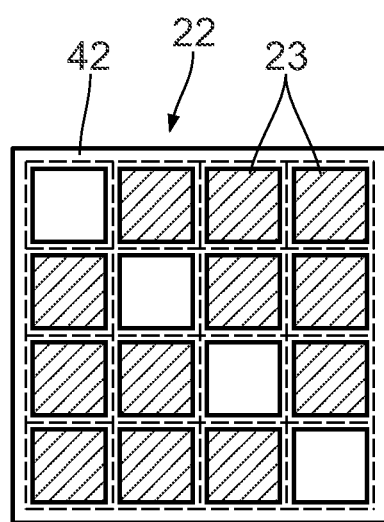
FIG. 12 shows an illustration of the mirror array in accordance with FIG. 11, in which the individual mirrors are subdivided into two different groups.

The illustration of the individual mirrors 23 in FIG. 12 should be understood to be by way of example. The actual number of the individual mirrors 23 of the mirror array 22 can be substantially larger. The percentage of the individual mirrors 23 of the second group in terms of the overall number of individual mirrors 23 of the mirror array 22 is at most 10%; it lies in particular in the range from 0.1% to 10%, in particular in the range from 1% to 10%, in particular in the range from 3% to 5%. Depending on the desired properties, the percentage of the individual mirrors 23 of the second group in terms of the number of individual mirrors 23 of the mirror array 22 can also be higher. In principle, it can be up to 100%.

The individual mirrors 23 of the first group are positionable with an accuracy of at least 1 mrad, in particular at least 500 μrad, in particular at least 200 μrad, in particular at least 100 μrad, in particular at least 50 μrad. In particular, they are displaceable with a relative accuracy of better than 1:100, in particular better than 1:300, in particular better than 1:500, in particular better than 1:1000, in particular better than 1:2000.

They have an overall displacement extent of up to 100 mrad, in particular up to 200 mrad, in particular up to 300 mrad, in particular up to 500 mrad. The overall displacement extent of the individual mirrors 23 of the first group can be in particular at least 10 mrad, in particular at least 20 mrad, in particular at least 30 mrad, in particular at least 50 mrad.

The individual mirrors 23 of the second group are displaceable with a very short switching time. The switching time for displacing the individual mirrors 23 of the second group from an initial position into a defined end position is in particular less than 100 ms, in particular less than 5 ms, in particular less than 2 ms, in particular less than 1 ms, in particular less than 500 μs, in particular less than 200 μs. Below, the individual mirrors 23 of the second group are also referred to as fast individual mirrors 23.

The individual mirrors 23 of the second group can have a smaller overall displacement extent than the individual mirrors 23 of the first group. The overall displacement extent of the individual mirrors 23 of the second group can be in particular less than 50 mrad, in particular less than 30 mrad, in particular less than 20 mrad, in particular less than 10 mrad. This assists the quick displacement of the individual mirrors 23 of the second group.

An actuation with a control loop is provided for displacing and/or positioning the individual mirrors 23 of the first group. In particular, the individual mirrors 23 of the first group are positioned with feedback. Here, inaccuracies in the positioning in particular can be corrected via the control loop.

The individual mirrors 23 of the second group are displaced via pure forward-coupled control (feedforward control). In particular, the individual mirrors 23 of the second group are positioned and/or displaced without feedback. As a result of this, the switching time for displacing the individual mirrors 23 of the second group is substantially reduced.

The individual mirrors 23 of the two groups can have identical circuits for the displacement. In particular, it is possible for all individual mirrors 23 of the mirror array 22 to have a control loop, i.e. feedback, for the positioning and/or displacement thereof. These control loops can each be activatable and deactivatable in a flexible manner. As a result of this, it is possible to flexibly select the assignment of the individual mirrors 23 to the two groups, in particular to modify this, in particular to modify this when operating the projection exposure apparatus 1.

By reducing the maximum possible or maximum provided switching paths of the individual mirrors 23 of the second group, it is possible, firstly, to further reduce switching time; secondly, this can keep the absolute accuracy of the positioning of the individual mirrors 23 of the second group within predetermined limits. In particular, it is possible to ensure that the individual mirrors 23 of the second group are also positionable with an absolute accuracy which is better than 10 mrad, in particular better than 5 mrad, in particular better than 2 mrad, in particular better than 1 mrad.

Moreover, the ingress of large thermal loads from the electronics into the system can be avoided by the reduced switching paths.

By reducing the overall displacement extent of the individual mirrors 23 of the second group, it is possible to improve the thermal balance thereof. Reducing the overall displacement extent renders it possible, in particular, to reduce the slew rates for the fast displacement, and hence the bias currents. As a result of this, the power dissipation and hence, in particular, the thermal dissipation can be reduced.

In particular, the arrangement of the fast micro-mirrors 23 in the mirror array 22 can be selected in such a way that, firstly, each region of the object field 5 is sufficiently modulable in terms of the scan-integrated intensity of the illumination radiation 10, while, secondly, the structural, technical realization of the mirror array 22 is simplified.

Figure 20:
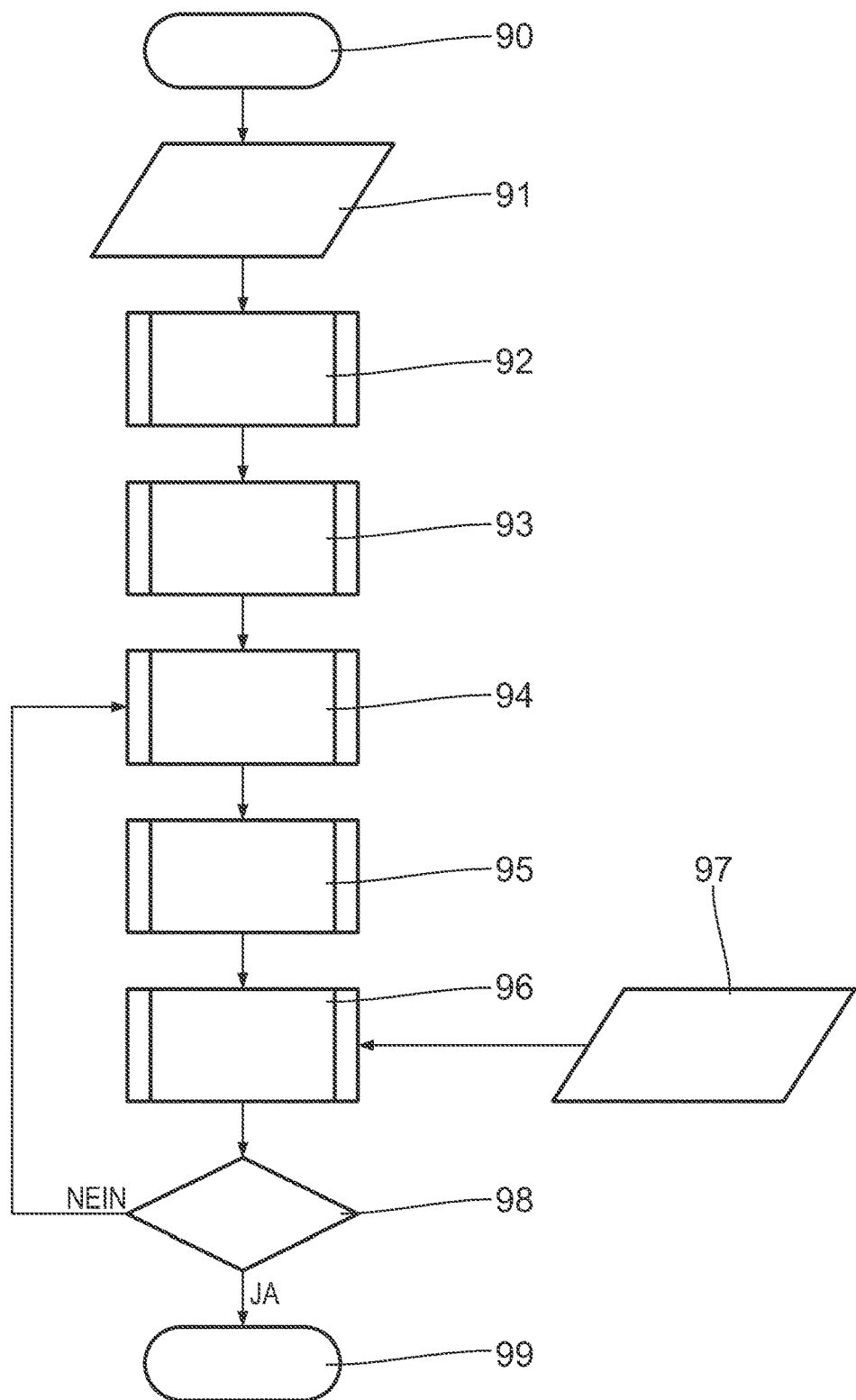

Below, a method for designing the facet mirror 62 is described with reference to FIG. 20.

Initially, the facet mirror 62 is provided in a provision step 90. Thereupon, at least one illumination setting for illuminating the object field 5 is predetermined in a selection step 91.

The illumination channels for setting the illumination settings, i.e. the assignment of the first facets 68 to the second facets 69, are determined in a first determination step 92.

Thereupon, the geometry and/or the partial field illumination at the reticle 29 are determined in a second determination step.

The geometry of the corresponding original images on the facet mirror 62 are determined in a subsequent third determination step.

Thereupon, these original images are arranged on the facet mirror 62 in an arrangement step 95. In particular, they are arranged therein such that a packing density and/or packing efficiency, which is as high as possible, of the illumination results on the facet mirror 62.

The proportion of the fast individual mirrors 23 assigned to the second group is determined in a subsequent fourth determination step 96.

The illumination of the reticle 24 is tested (sampling) in a test step 97.

Thereupon, a decision is made in a decision step 98 as to whether the proportion of fast mirrors 23 is sufficient. If this is not the case, the method is continued with another arrangement step 95. If the proportion of the fast individual mirrors 23 is sufficient, it is possible to start with the illumination 99 of the object field 5.

It is also possible to take into account different illumination settings during the arrangement step 95. In this case, a plurality of illumination settings are selected in the selection step 91. The subsequent steps are adapted accordingly.

Preferably, the fast individual mirrors 23 are arranged in the mirror array 22 in such a way that the arrangement is robust in relation to the arrangements of the facets 68, which are generally dependent on the setting, on the first facet mirror 62. Such an arrangement can be found with the aid of the method schematically illustrated in FIG. 20.

To the extent that the second facet mirror 63 is a pupil facet mirror, the channel number is setting-independent, particularly to the extent that the facets 69 of the second facet mirror 63 are not intended to be switched. In this case, it is sufficient to run through the process depicted schematically in FIG. 20 only once. In general, the process can also be run through a number of times. This is advantageous, particularly when designing the first facet mirror in combination with a specular reflector.

In particular, the fast mirrors can be arranged along straight lines in the mirror array 22. If a proportion a of fast mirrors 23 is predetermined and if the overall number of individual mirrors 23 and the number of the first facets 68 of the first facet mirror 62 are known, it is possible to determine a line density of the fast individual mirrors 23 in the mirror array 22.

In the case of a specular reflector, the arrangement of the facets 68 in the first facet mirror 62 changes for each illumination setting. The method described above is carried out for each individual illumination setting in this case. In this case, the arrangement of the fast individual mirrors 23 is advantageously determined via a global optimization method. As an alternative thereto, the arrangement of the facets 68 on the first facet mirror 62 can be redefined for each setting.

An advantageous arrangement of the fast individual mirrors 23 is described below on the basis of FIGS. 13 to 15.

Figure 13:
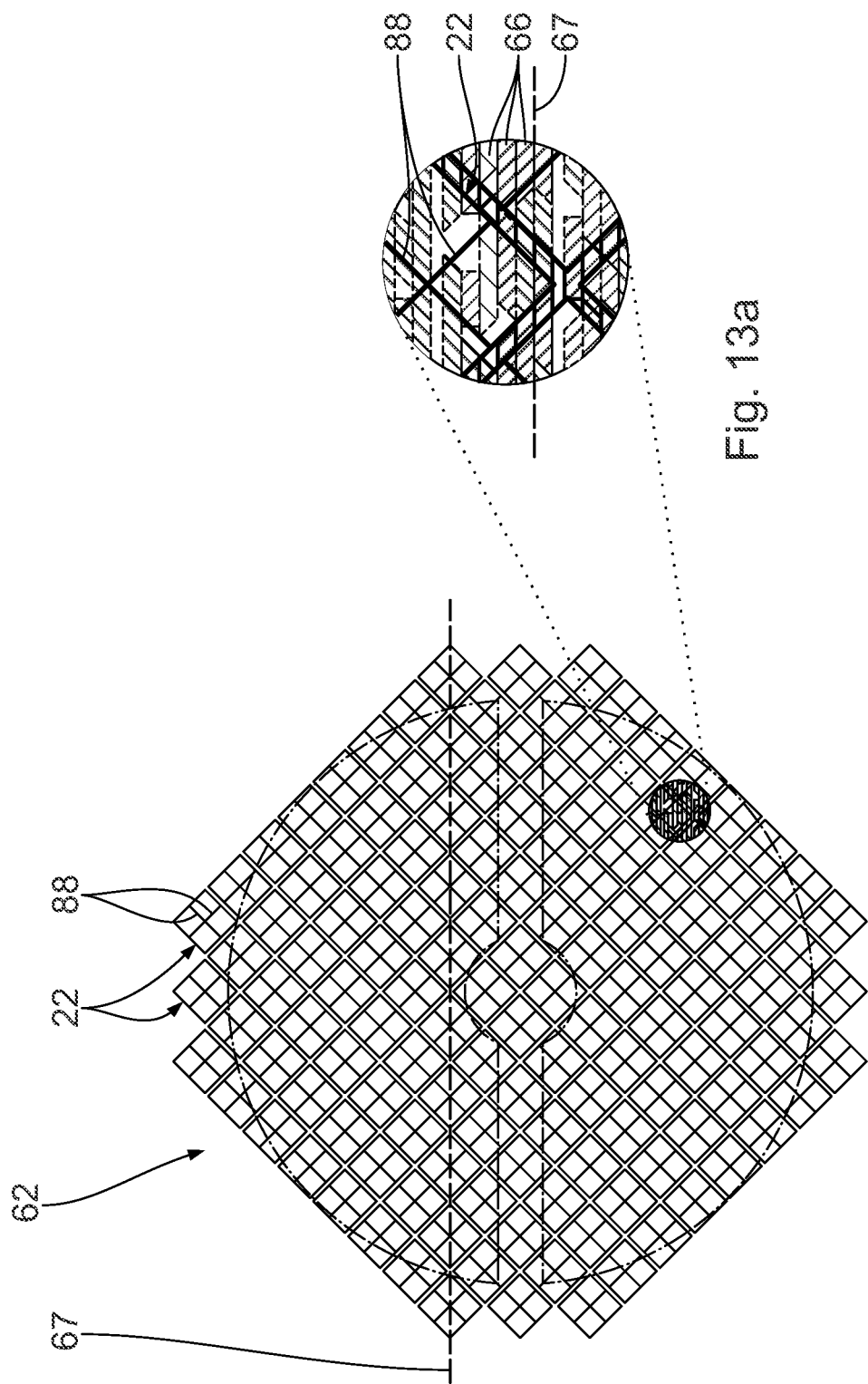
FIG. 13 and FIG. 14 show schematic illustrations of different arrangements of field facets on the field facet mirror, which is formed by a multiplicity of mirror arrays.
Figure 14:
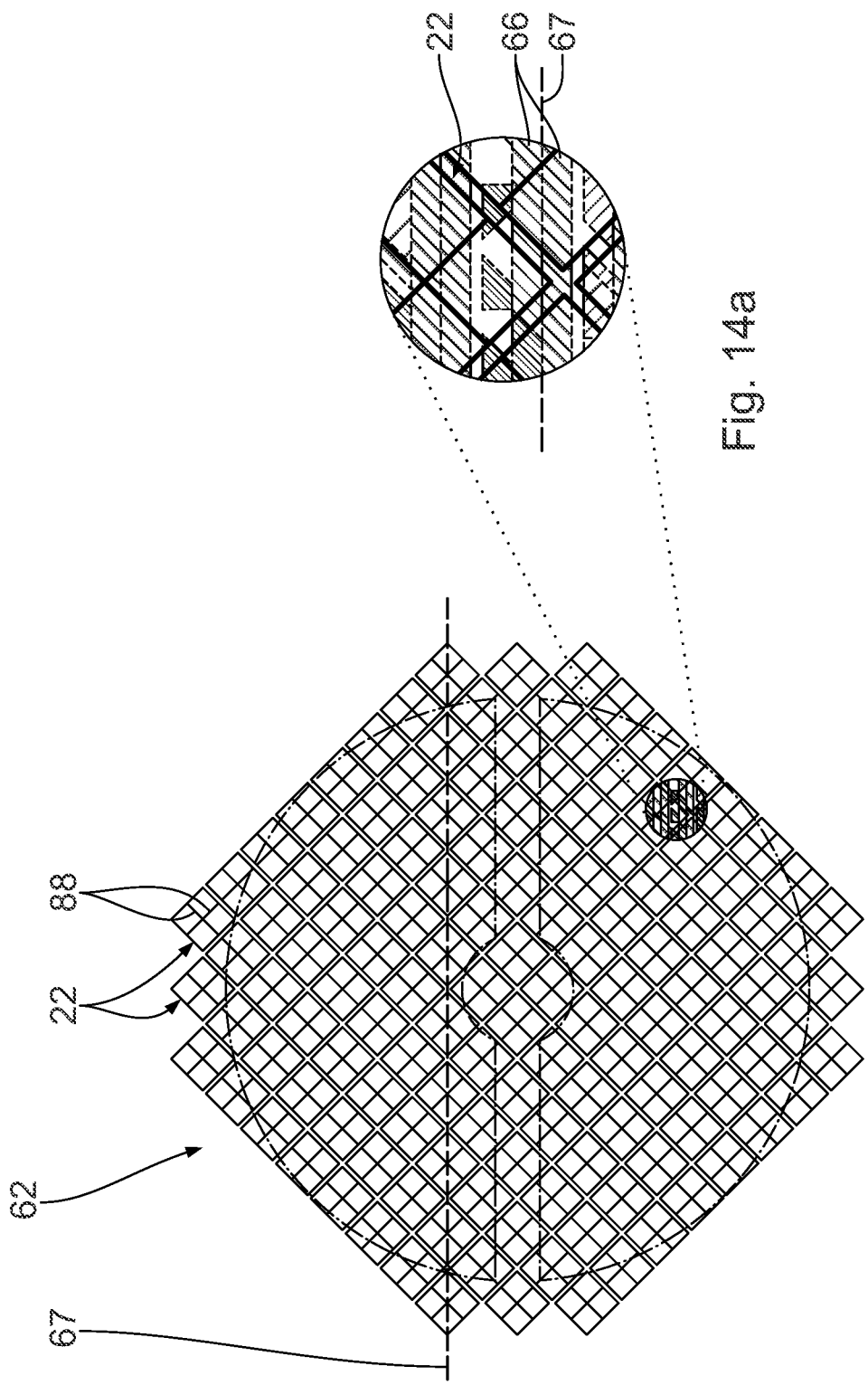

In FIGS. 13 and 14, partial fields 66 are depicted on the first facet mirror 62 in an exemplary manner. Each one of the partial fields 66 depicted in an exemplary manner corresponds to a field facet 13a. The partial fields 66 are composed in each case from individual mirrors 23 of the mirror arrays 22 not depicted in detail in the figures. FIGS. 13 to 15 schematically depict the coverage of the field facets 13a with the mirror arrays 22. Here, the lines 88 on the mirror arrays 22 characterize the arrangement of the fast individual mirrors 23, i.e. the arrangement of the individual mirrors 23 of the second group of the mirror arrays 22.

The two figures show, in an exemplary manner, arrangements of the field facets for two different illumination settings in the specular reflector. The puzzling is different for each setting.

In the example depicted in FIGS. 13 and 14, the fast individual mirrors 23 are each arranged in a line and a column along the median of the mirror array 22.

The mirror arrays 22 are arranged in such a way that the lines and columns thereof are twisted relative to a longitudinal direction 67 of the field facets 13a. The lines and columns of the individual mirrors 23 of the mirror array 22 include, in particular, an angle in the range from 10° to 80°, in particular in the range from 30° to 60° with the longitudinal direction 67 of the field facets 13a. The lines and/or columns of the individual mirrors 23 of the mirror array 22 can include, in particular, an angle of 37° or an angle of 45° with the longitudinal direction 67 of the field facets 13a.

Figure 15:
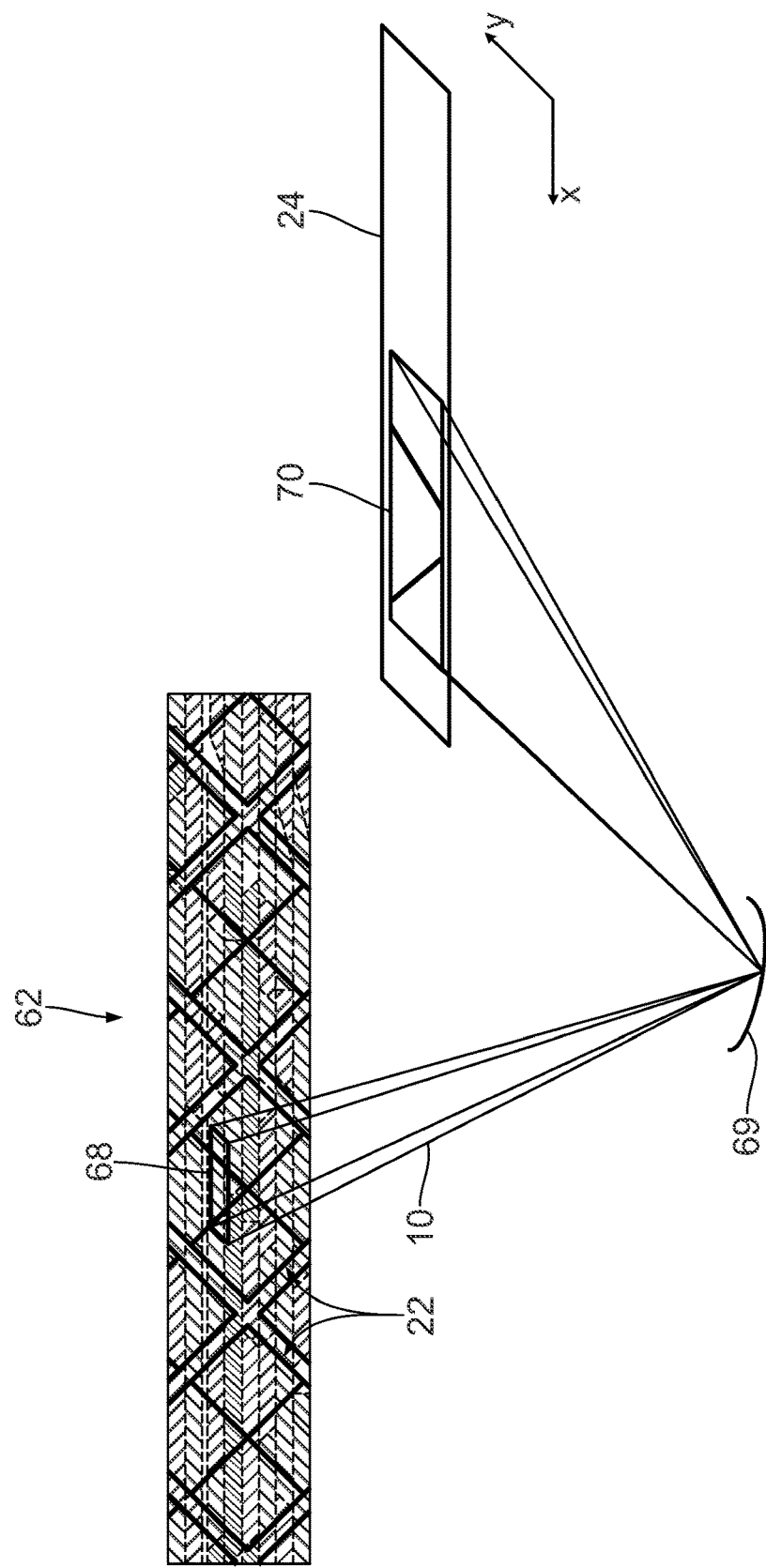
FIG. 15 shows a schematic illustration of a section of the beam path of a projection exposure apparatus in accordance with FIG. 8 including a facet mirror in accordance with either of FIGS. 13 and 14.

FIG. 15 depicts, in an exemplary manner, a sectional magnification of a portion of the first facet mirror 62 and, in an exemplary manner, a beam path from a facet 68 to the reticle 24. The facet 68 of the first facet mirror 62 is imaged in an image 70 in the object plane 6 via a facet 69 of the second facet mirror 63, which is not depicted in any more detail in FIG. 15 for reasons of simplicity. The facet 68 leads to an image 70 in the region of the object field 5 which is smaller than the dimensions of the reticle 24.

Together with the facet 69, the facet 68 defines an illumination channel.

As depicted in FIG. 15 in an exemplary manner, the fast individual mirrors 23 are arranged in such a way that the image thereof in the object plane 6 extends obliquely in relation to the y-direction, i.e. obliquely in relation to the scanning direction. What can be achieved hereby is that the fast individual mirrors 23 can be used to correct an intensity distribution of the illumination radiation 10 in the region of the object field 5 and/or to change the dose in the image field 8, in particular to adapt the radiation dose for exposing the wafer 64. In particular, the fast individual mirrors 23 can be used to correct the scan-integrated intensity in the region of the object field 5. By quickly displacing the individual mirrors 23 of the second group, it is possible, in particular, to set and/or adapt an intended profile for exposing a field (die) on the wafer 64. In particular, it is possible to displace the individual mirrors 23 of the second group between the exposure of two different fields on the wafer 64 (inter die displacement). As a result of this, it is possible to compensate differences, determined in advance, between the different fields on the wafers to be exposed, in particular the systematic errors connected therewith, at least in part, in particular completely.

As a result of a targeted arrangement of the fast individual mirrors 23 in the mirror array 22 and/or the alignment of the mirror arrays 22 on the first facet mirror 62 and as a result of a targeted channel assignment, i.e. an assignment of the facets 68 of the first facet mirror 62 to the facets 69 of the second facet mirror 63, it is possible to influence in a targeted manner, in particular optimize, the modulability of the illumination radiation 10 in the region of the object field 5, in particular in the region of the reticle 24.

By displacing the fast individual mirrors 23, it is possible, in particular, to couple and/or decouple illumination radiation 10 into/from the beam path directed to the object field 5, in particular to the reticle 24. In other words, by tilting the fast individual mirrors 23 it is possible to influence in a targeted manner, in particular modulate, the intensity distribution of the illumination radiation 10 in the region of the object field 5, in particular in the region of the reticle 24. This relates in particular to the scan-integrated intensity.

By tilting, in particular switching, the fast individual mirrors 23, it is therefore possible, in particular, to modulate the dose of the illumination radiation 10 in the region of the image field 8.

When using the projection exposure apparatus 1 with one of the collector variants described above, the reticle 24 and the wafer, which carries a coating which is light-sensitive to the illumination light 10, are provided. Subsequently, at least one portion of the reticle 24 is projected onto the wafer with the aid of the projection exposure apparatus 1. When projecting the reticle 24 onto the wafer, the reticle holder and/or the wafer holder can be displaced in the direction parallel to the object plane 6 or parallel to the image plane 9. The displacement of the reticle 24 and of the wafer can preferably be carried out in a manner synchronous to one another. Finally, the light-sensitive layer on the wafer that has been exposed with the illumination light 10 is developed. A microstructured or nanostructured component, in particular a semiconductor chip, is produced in this way.

Further aspects of the disclosure are described below with reference to FIGS. 16 to 19.

In the figures, the facets 69 of a portion of the second facet mirror 63 are depicted in an exemplary manner. The facets 69 not used in a specific illumination setting are depicted in an exemplary manner by way of open circular rings 74. The facets 69 used in the illumination setting are depicted as hatched circles 75.

For clarification purposes, target facets 71, which will still be described in more detail below, are depicted by filled-out symbols in FIGS. 16 to 18. The square symbol reproduces, in an exemplary manner, a park facet 73 which is still described in more detail below.

Since a displacement of the first facets 68, in particular of the individual mirrors thereof, leads to a corresponding trajectory of the image thereof on the second facet mirror 63, the position of the image of a facet 68 of the first facet mirror 62 in the region of the second facet mirror 63 is also, in a simplified manner, referred to below as position of the respective facet 68, in particular of the individual mirrors thereof.

In accordance with one aspect of the disclosure, provision is made for the fast individual mirrors 23 to be used for the dose control, in particular for the fast dose control, i.e. for a fast change, in particular correction, of the illumination, in particular of the intensity distribution, of the object field 5. What is exploited to this end is that the individual mirrors 23 can, firstly, be positioned in such a way that they contribute to the illumination of the object field 5 and, secondly, also be positioned in such a way that they do not contribute to the illumination of the object field 5, in particular not in the way of scattered light or stray light either. The fast individual mirrors 23 can be switched to and fro between such positionings during the exposure of the wafer 64.

In particular, what was identified was that the fact that the first facet mirror 62 includes a multiplicity of individual mirrors 23, in particular micro-mirrors, renders it possible to use these individual mirrors 23 as dose manipulators. It is possible to dispense with a so-called finger UNICOM.

A change in the intensity profile of the illumination radiation 10 in the object field 5 between the illumination of two fields (dies) involves switching times of a few tens of ms. Such a quick switching ability is possible with the fast mirrors 23 according to the disclosure. In particular, the switching time of the fast individual mirrors 23 is shorter than the time to drive the wafer 64 from one just exposed field to the next.

With the fast individual mirrors 23, it is also possible to adapt the local dose during the exposure (intra-die modulation).

A y-ReMa functionality is also possible. In particular, it is possible to modify the size of the actually illuminated region of the object field 5, which is also referred to as the illumination field, during the exposure. As a result of this, the functionality of an adjustable field stop, in particular of a so-called reticle-masking stop (ReMa stop), can be achieved. By displacing the fast individual mirrors 23, the illumination field can be enlarged and reduced again, particularly in the scanning direction during the scanning process. By displacing the individual mirrors 23, it is possible to ensure, in particular, that the dimensions of the illumination field in the scanning direction, i.e. in the y-direction, are continuously increased at the start of the scanning process and reduced again at the end of the scanning process. In respect of further details about this, reference is made to DE 10 2012 213 515 A1, in particular paragraphs [0072] to [0085].

When displacing the individual mirrors 23, it is ensured in each case that facets 69 of the second facet mirror 63 which in an unwanted manner image the individual mirror 23 to be switched of the facet 68 of the first facet mirror 62 into the object field 5 or into the vicinity thereof are not encountered on the switching trajectory. In particular, it is ensured that the individual mirrors 23 on the switching trajectory thereof do not contribute to an exposure of the wafer 64 in the image field.

Below, a few variants of how the switching time for the switching processes can be reduced and/or the illumination of unwanted facets 69 of the second facet mirror 63 can be prevented are illustrated in an exemplary fashion.

When illuminating the object field 5, i.e. when imaging the reticle 24 onto the wafer 64, provision is made for one or more target facets 71 on the second facet mirror 63 to be determined for each facet 68 of the first facet mirror 62, by which one or more target facets the illumination radiation 10 reflected by the facet 68 in each case is intended to be guided to the object field 5. In FIGS. 16 to 18, such target facets 71 are depicted by filled-up circles in an exemplary manner.

The positioning of the facets 68 on the first facet mirror 62, which leads to a corresponding channel assignment, i.e. to a guidance of illumination radiation 10 from the individual mirror 23 or the facet 68 to the target facet 71, is also referred to as target position.

It should be recalled that the facets 68 are formed by a multiplicity of individual mirrors 23. When reference is made to a positioning of the facets 68 below, this should be understood, in each case, to mean the positioning of the individual mirrors 23 which form this facet 68. In particular, the target positions of the facets 68 are understood in each case to mean the target positions of the individual mirrors 23 which form the respective facets 68. For the fast fine-tuning of the illumination properties, individual ones of the individual mirrors 23, which form a given facet 68, then can be switched on, off or over on an individual basis. In particular, they can be displaced into a target position or out of a target position or between two target positions.

For a predetermined intended illumination of the object field 5, such target positions, i.e. displacement positions, are determined for the facets 68 of the first facet mirror 62.

Moreover, forbidden positions, into which the facets 68 are not be displaced, can be determined in each case for the facets 68 of the first facet mirror 62. The associated forbidden positions 72 on the second facet mirror 63 for the facet 68, the target facet(s) 71 of which are highlighted in an exemplary manner, are in each case denoted by a small x in an exemplary manner. The forbidden positions also relate in each case to all of the individual mirrors 23 of the respective facet 68.

Moreover, in the figures, a so-called park facet 73 is denoted in each case for each target facet 61 by way of a square symbol. In general, provision is made for at least one park position to be determined in each case, at least for a subset of the first facets 68, which park position is respectively spaced apart from the associated target position, but at most by a maximum distance $d_{max}$. In the depicted examples, the distance d between the park position and the associated target position is just one facet diameter. In other words, the park facet 73 is precisely a facet 69 adjacent to the target facet 71. The park positions also relate in each case to all of the individual mirrors 23 of a given facet 68. However, conventionally, only a subset of the individual mirrors 23 which form a given facet 68 is displaced into a park position.

In principle, all individual mirrors 23 which form a given facet 68 can be displaced into the same park position. Advantageously, provision is made for the individual mirrors 23 which form a given facet 68 to be distributed to different park positions for the purposes of being switched off. As a result of this, the thermal load on the park facets 73 can be reduced. In particular, it is possible to distribute the thermal load as uniformly as possible to different park facets 73.

When illuminating the object field 5, provision is made for a subset of the individual mirrors 23 of the first facets 68 to be positioned in park positions. Since the park positions in each case have a distance from a given target position of at most the maximum distance $d_{max}$, these individual mirrors 23 can be added, i.e. displaced into the respective target position, with a very short switching path. In particular, they can be added with a very short switching time.

The switching time for displacing one of the individual mirrors 23 of the first facets 68 of the first facet mirror 62 from a park position into the associated target position or, conversely, from a target position into a park position is in particular at most 200 ms, in particular at most 100 ms, in particular at most 50 ms, in particular at most 20 ms, in particular at most 10 ms, in particular at most 5 ms, in particular at most 2 ms, in particular at most 1 ms, in particular at most 500 µs, in particular at most 200 µs, in particular at most 100 µs.

Figure 16:
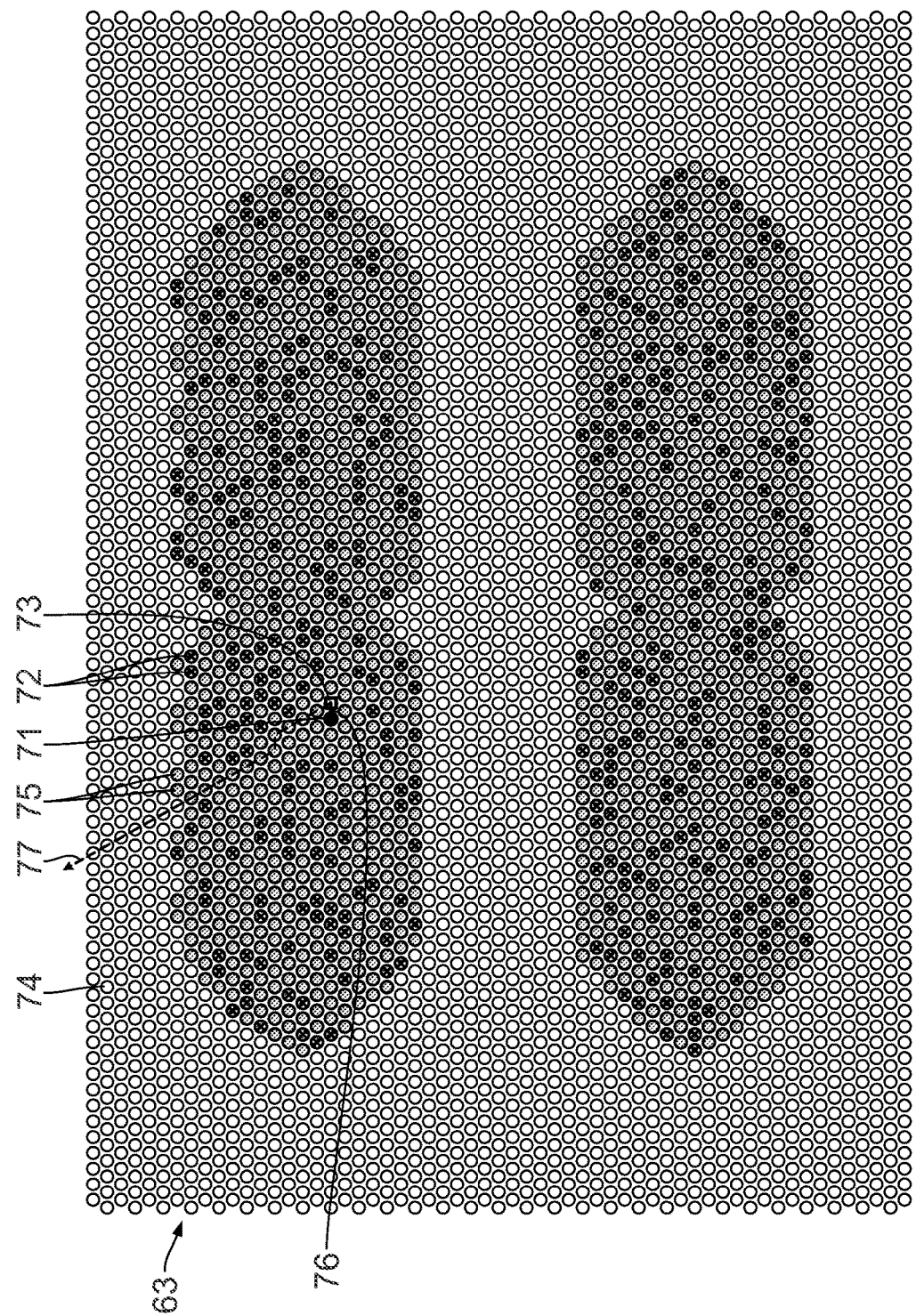
FIG. 16 shows a schematic illustration of the alignment of a second facet mirror, with a target position, an associated park position and a multiplicity of forbidden positions being labeled.
Figure 17:
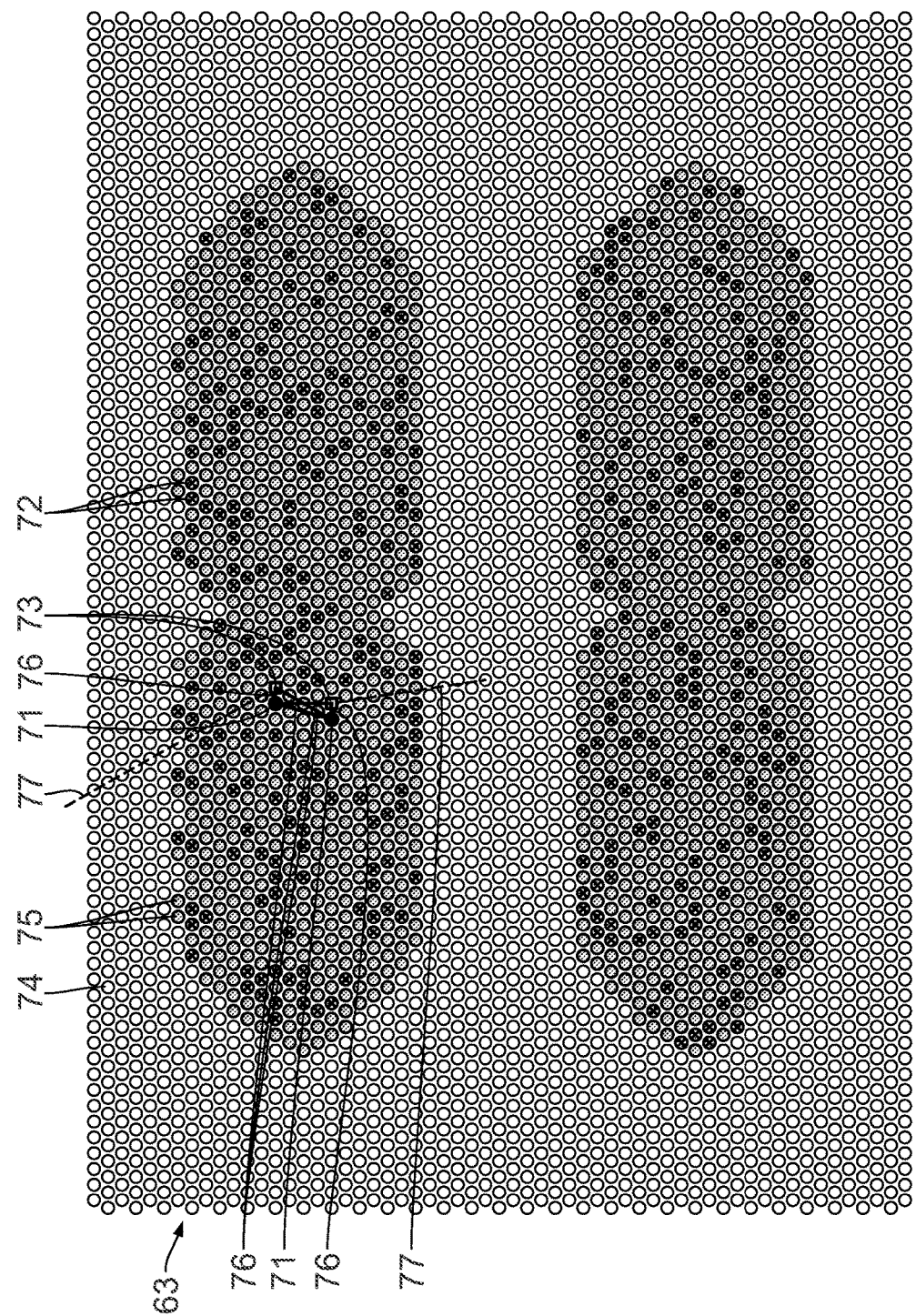
FIG. 17 and FIG. 18 show schematic illustrations in accordance with FIG. 16 with two target positions, two park positions and a multiplicity of forbidden positions, FIG. 19 schematically shows a temporal progression of a method for illuminating an object field of a projection exposure apparatus, and FIG. 20 schematically shows a progress of a method for designing a facet mirror.
Figure 18:
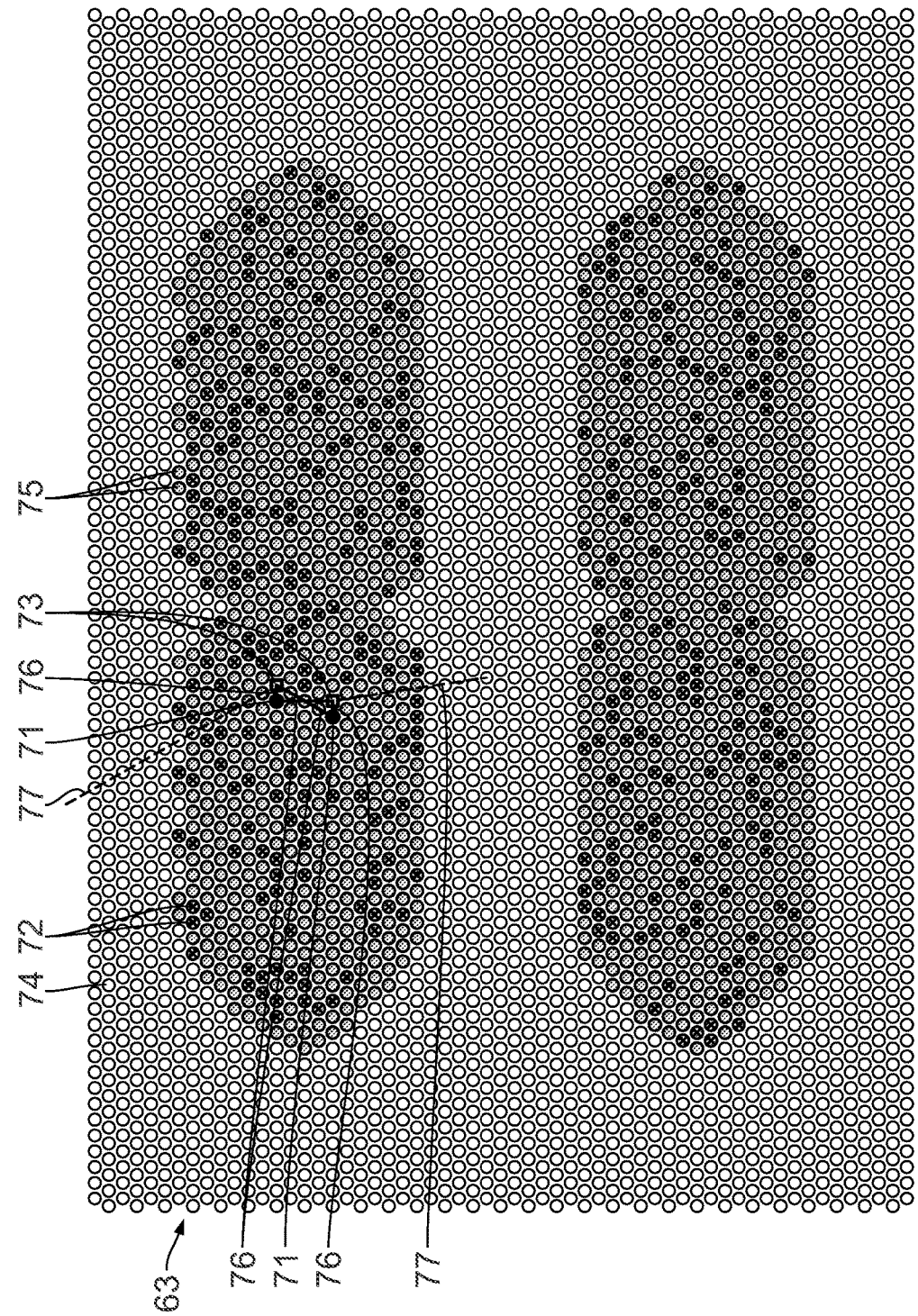

The displacement path 76 for such a fast displacement of the individual mirrors 23 of the first facets 68 from a park position into a target position or the other way around is denoted in FIGS. 16 to 18 by a full line.

Displacement paths 77 for slower displacements are depicted by dashed lines in the figures in an exemplary manner.

The slow displacements can be carried out with a switching time of more than 200 ms, in particular with a switching time of up to 1 s, in particular of up to 2 s, in particular up to 5 s. They can be carried out very precisely. In particular, they can be carried out with a relative accuracy which is better than 1:1000. The absolute accuracy when displacing the first facets can be better than 1 mrad, in particular better than 500 µrad, in particular better than 200 µrad, in particular better than 100 µrad, in particular better than 50 µrad. This applies in particular to the slow positioning.

On account of the short distance, a relative accuracy in the range of 1% to 10% is sufficient for the fast displacement of the individual mirrors 23. As a result of this, the realization of a very short switching time is significantly simplified.

The individual mirrors 23, in particular the individual mirrors 23 which are provided for setting the dose, can be displaced into one of the provided park positions, particularly during a phase in which the wafer 64 is not exposed. They can also be displaced into one of the park positions during a phase in which, although the wafer 64 is exposed, they do not contribute to this exposure. In the process, it is ensured that they do not assume any of the forbidden positions 72 during the displacement. In particular, it is possible to ensure that they observe a minimum distance $d_{min}$ from the forbidden positions 72 during such a displacement.

The target positions of all individual mirrors 23 are selected and/or constructed in such a way that they are in each case spaced apart from the closest forbidden position 72 by a minimum distance $d_{min}$ of at least one facet diameter, in particular by at least two or three facet diameters.

There are sufficiently many close park facets 73 for each target position, in particular at least 1, in particular at least 2, in particular at least 3, in particular at least 6.

In particular, the target facets 71 are completely surrounded by park facets 73. In particular, they are arranged at a distance from the closest forbidden position 72. In particular, they have a minimum distance $d_{min}$ of at least one facet diameter, in particular two or three facet diameters, from the closest forbidden position 72.

FIG. 17 depicts, in an exemplary manner, a variant in which one of the first facets 68 is assigned to two different target facets 71 with associated park facets 73.

The full lines once again depict the displacement paths 76 for the fast displacements. As depicted in an exemplary manner, the individual mirrors 23 of the corresponding first facet 68 can not only be added or switched off quickly, they can also be quickly switched over between the two target facets 71. Likewise, it is possible to switch the individual mirrors 23 quickly from the park facet 73 of the one target facet 71 to the other target facet 71, or vice versa.

FIG. 18 schematically shows a case in which the displacement speed of the individual mirrors 23 of the first facet mirror 62 is slower than in the exemplary embodiment depicted in FIG. 17. In the case depicted in FIG. 18, the individual mirrors 23 of the corresponding first facet 68, in particular the individual mirrors 23 of the same, can be quickly switched to and fro between the park positions and the associated target positions but quick switching over between the two target positions is not provided.

Direct switching between the two target facets 71 is not provided in the exemplary embodiment depicted in FIG. 18. This can be advantageous in favor of increased precision.

Figure 19:
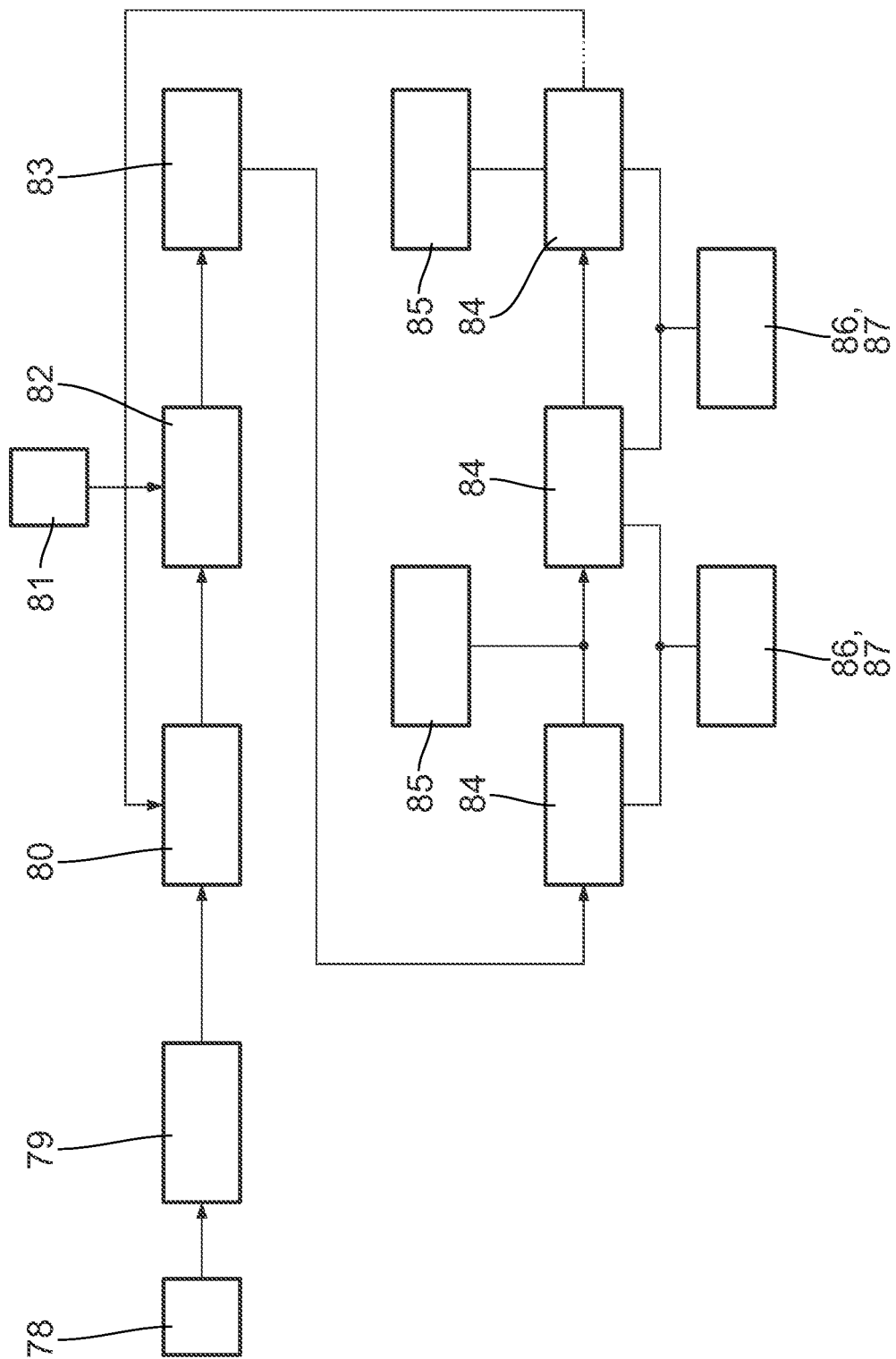

The temporal progression of setting the first facets 68, in particular the individual mirrors 23 of same, is once again illustrated below in an exemplary manner on the basis of the flowchart in accordance with FIG. 19.

Initially, a reticle 24 to be imaged is provided in a first provision step 78.

Thereupon, an intended illumination of the object field 5, in particular of the reticle 24, is predetermined in a prescription step 79. The intended illumination, which is also referred to as nominal illumination of the reticle 24, determines, in particular, the field dimensions, field form and angular distribution of the illumination radiation 10. It is calculated and adjusted taking into account the current best knowledge about the properties of the projection exposure apparatus 1, in particular the properties of the illumination system 2 and/or the projection optical unit 7. To this end, a calculation and adjustment step 80 is provided. The calculation and adjustment step 80 includes determining the target positions for the first facets 68, in particular the individual mirrors 23 thereof, in a manner dependent on the predetermined intended illumination. The adjustment step 80 moreover includes displacing the first facets 68, in particular the individual mirrors 23 thereof, into the corresponding target positions. If the second facets 69 are switchable facets, the normals thereof are also calculated and adjusted in such a way that the images of the first facets land in the object field 5.

Thereupon, a new wafer 64 is provided in a second provision step 81.

Thereupon, the distribution of the illumination radiation 10 in the region of the reticle 24 and/or in the region of the wafer 64 is determined in a measurement step 82. Suitable sensors are provided to this end. The measurement step 82 can be carried out before the second provision step 81.

In particular, in the measurement step 82, it is possible to measure properties such as the intensity profile, the uniformity, the ellipticity, the telecentricity or the angular distribution of the illumination radiation 10 at the wafer 64.

In general, the actual illumination established in the measurement step 82 deviates from the predetermined intended illumination by a certain deviation. This deviation can be corrected by switching a subset of the first facets 68 or the individual mirrors 23 thereof. To this end, those individual mirrors 23, which should serve as correction mirrors, are initially determined in a determination step 83. In particular, the fast individual mirrors 23 described above serve as correction mirrors.

What is moreover taken into account when determining the correction mirrors is that each field on the wafer 64 involves an individual intensity profile. The determination step 83 includes determining the first facets 68, in particular the individual mirrors 23 thereof, which are to be switched to this end. In so doing, it is possible to take into account, in particular, information about the wafer which is established in advance or provided, in particular information about the variation of the properties of said wafer over its surface, in particular about the variation between different fields of the wafer 64 to be exposed. In particular, provision can be made for correction mirrors to be determined for each one of the fields on the wafer 64 to be exposed, which correction mirrors are intended to be switched on, off or over, in particular during the dead time between the successive exposure of two fields (inter die displacement). A corresponding switching protocol can be stored in a control device, in particular in a memory of a control device. A corresponding control protocol can be recalled and executed in an automated manner during the exposure of the wafer 64.

Moreover, the determination step 83 can include establishing the forbidden positions 72 for the first facets 68 to be switched, in particular for the individual mirrors 23 thereof. In principle, this can also already be predetermined before the calculation and adjustment step 80. However, it can be advantageous to verify the permitted and, in particular, the forbidden positions 72 in the actual system.

Thereupon, a field on the wafer 64 is exposed during an exposure step 84.

A multiplicity of exposure steps 84 are provided for exposing the whole wafer 64. Here, respectively one field (die) on the wafer 64 is exposed in a scanning or step-wise manner. Fast switching processes 85 can take place during the exposure of a field or in the pauses between the exposure of two fields. Here, predetermined individual mirrors 23 of the first facets 68 are switched onto, or away from, predetermined second facets 69. It is also possible to switch predetermined individual mirrors 23 of the first facets between different second facets 69. Initial point or target point for the fast switching processes 85 is the predetermined park position, i.e. a park facet 73, or another target position, i.e. another target facet 71, in each case. In particular, the fast switching processes 85 involve a switching time of at most 200 ms, in particular at most 100 ms, in particular at most 50 ms, in particular at most 20 ms, in particular at most 10 ms, in particular at most 5 ms, in particular at most 2 ms, in particular at most 1 ms, in particular at most 500 µs, in particular at most 200 µs, in particular at most 100 µs.

The switching path is very short. In particular, it is at most 30 mrad, in particular at most 10 mrad, in particular at most 3 mrad.

So that the short switching paths can be realized, the first facets 68 to be added, in particular the individual mirrors 23 thereof, are displaced into the respective park positions at the times during which they are not used. To this end, a further switching process 86 is provided. If suitable displacement trajectories, in particular displacement trajectories which avoid all forbidden positions 72, are selected during this switching process 86, the switching process 86 can likewise take place during the exposure of the wafer 64.

Moreover, the facets 68, in particular the individual mirrors 23 thereof, in particular the position thereof, can be measured in a measuring and regulating process 87. This is provided, in particular, in those facets 68, in particular the individual mirrors 23 thereof, which were displaced. In particular, the measuring and regulating process 87 can use a control loop. In particular, the control loop can be run through iteratively. As a result of this it is possible for the accuracy of the switched facets 68 to successively be matched again to the accuracy of the remaining facets 68 over a relatively long period of time.

After the exposure of the wafer 64, the reticle 24 can be imaged on a further wafer 64. To this end, provision is made of repeating the measurement step 82 and the subsequent determination step 83 for determining the correction mirrors. Here, small corrections of the field of the next wafer 64 can be calculated and the positioning of the facets 68, in particular of the individual mirrors 23 thereof, can be adapted accordingly.

The procedure is restarted if there is a fundamental change in the intended illumination of the reticle 24, for example because a new reticle 24 is intended to be used.

What is claimed is:

1. A method of illuminating an object field of a projection exposure apparatus, the projection exposure apparatus comprising an illumination device configured to generate illumination radiation and an illumination optical unit configured to guide the illumination radiation from the illumination device to the object field, the illumination optical unit comprising a first facet mirror comprising a multiplicity of first facets and a second facet mirror comprising a multiplicity of second facets, each first facet comprising a multiplicity of displaceable individual mirrors, each first facet being assignable to at least one of the second facets to define at least one illumination channel, the method comprising:

for each individual mirror of each first facet, determining:
a target position in a manner dependent on a predetermined intended illumination of the object field;
a maximum, non-zero spacing from the target position; and
at least one park position which is spaced from the target position by at most the maximum, non-zero spacing from the target position; and positioning the individual mirrors of the first facets so that, for each individual mirror of a subset of the individual mirrors of the first facets, the individual mirror is positioned in one of the at least one park positions;

using the illumination optical unit to illuminate structures of a reticle located in the object plane;

using a projection optical unit to project illuminated structures of the reticle onto a light sensitive material in an image plane of the projection optical unit; and at least one of the following:
displacing at least some of the individual mirrors of the first facets from a park position into an associated target position while illuminating structures of the reticle;
displacing at least some of the individual mirrors of the first facets from target position into a park position while illuminating structures of the reticle; and
displacing at least some of the individual mirrors of the first facets from a first target position into a second target position while illuminating structures of the reticle, wherein the first target position is different from the second target position, wherein the method further comprises at least one of the following:
displacing at least some of the individual mirrors of the first facet to achieve a y-ReMa functionality;
using different switching times for different subsets of the individual mirrors of the first facets; and
displacing subset of the individual mirrors of the first facets which are not employed for illuminating the object field into Previously Presented park positions during the illumination of the object field, between two illuminations of the object field or both.

2. The method of claim 1, further comprising, for the individual mirrors of the first facets positioned in the park positions, displacing the individual mirrors from the park position into the associated target position within a switching time of at most 200 milliseconds.

3. The method of claim 1, wherein the subset of the individual mirrors of the first facets positioned in the park positions comprises from 0.1% to 10% of an overall number of the individual mirrors of the first facets.

4. The method of claim 1, wherein each target position is completely surrounded by park positions.

5. The method of claim 1, further comprising determining forbidden positions for at least some of the first facets, wherein, for the at least some of the first facets, the individual mirrors of the first facets may not be displaced into the forbidden positions.

6. The method of claim 5, further comprising determining the target positions so that each target position has a minimum distance from a closest forbidden position.

7. The method of claim 1, further comprising determining an actual illumination of the object field while illuminating the object field.

8. The method of claim 7, further comprising, when the determined actual illumination deviates from the intended illumination, displacing first facets to reduce the deviation.

9. The method of claim 1, wherein the maximum, non-zero spacing is one facet diameter.

10. The method of claim 1, further comprising, between the illumination of two dies, modulating a dose of illumination of the image plane of the projection optical unit by displacing at least some of the individual mirrors of the first facet.

11. The method of claim 1, further comprising, during illumination of the light sensitive material, adapting a dose of illumination of the image plane of the projection optical unit by displacing at least some of the individual mirrors of the first facet.

12. The method of claim 1, further comprising displacing at least some of the individual mirrors of the first facet to achieve a y-ReMa functionality.

13. The method of claim 1, further comprising using different switching times for different subsets of the individual mirrors of the first facets.

14. The method of claim 1, further comprising displacing a subset of the individual mirrors of the first facets which are not employed for illuminating the object field into Previously Presented park positions during the illumination of the object field, between two illuminations of the object field or both.

15. The method of claim 1, further comprising, during the illumination of the object field, displacing at least some of the individual mirrors of the first facets to correct at least one member selected from the group consisting of overall intensity of the object filed, a specific intensity profile of the object field, a specific angle distribution and uniformity of the illumination of the object field.

16. The method of claim 15, comprising correcting the illumination of the object field between the exposure of two successive fields, during the exposure of one field or both.

17. The method of claim 1, further comprising, during illumination of the light sensitive material, modifying illumination the exposure of the light sensitive material according to a correction protocol determined in a manner dependent on a heterogeneity of the light sensitive material.

* * * * *

UNITED STATES PATENT AND TRADEMARK OFFICE
CERTIFICATE OF CORRECTION

PATENT NO. : 10,409,167 B2
APPLICATION NO. : 15/226189
DATED : September 10, 2019
INVENTOR(S) : Martin Endres et al.

Page 1 of 1

It is certified that error appears in the above-identified patent and that said Letters Patent is hereby corrected as shown below:

In the Specification

Column 1, Line 13, delete "PCT EP" and insert -- PCT/EP --;

Column 21, Line 47, delete "a of" and insert -- of --;

In the Claims

Column 30, Lines 36-37 (approx.), Claim 14, delete "Previously Presented";

Column 30, Line 45 (approx.), Claim 15, delete "filed," and insert -- field, --.

Signed and Sealed this
Twenty-eighth Day of April, 2020

Andrei Iancu
*Director of the United States Patent and Trademark Office*